United States Patent
Lee et al.

(10) Patent No.: US 12,362,216 B2
(45) Date of Patent: Jul. 15, 2025

(54) PLASMA PROCESSING APPARATUS AND SEMICONDUCTOR FABRICATION METHOD USING THE SAME

(71) Applicant: Samsung Electronics Co., Ltd., Suwon-si (KR)

(72) Inventors: Daehyun Lee, Suwon-si (KR); Youngil Kang, Hwaseong-si (KR); Youngeun Kim, Seoul (KR); Jaesuk Kim, Hwaseong-si (KR); Minji Park, Seoul (KR); Sangwook Park, Seongnam-si (KR); Dongho Shin, Suwon-si (KR); Dongyun Yeo, Seoul (KR); Chunghun Lee, Hwaseong-si (KR); Kyoung-Mi Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 722 days.

(21) Appl. No.: 17/165,594

(22) Filed: Feb. 2, 2021

(65) Prior Publication Data

US 2022/0013397 A1    Jan. 13, 2022

(30) Foreign Application Priority Data

Jul. 9, 2020   (KR) .................. 10-2020-0084981

(51) Int. Cl.
*H01L 21/683*   (2006.01)
*H01J 37/32*   (2006.01)

(52) U.S. Cl.
CPC .... *H01L 21/6833* (2013.01); *H01J 37/32082* (2013.01); *H01J 37/32577* (2013.01); *H01J 37/32724* (2013.01)

(58) Field of Classification Search
None
See application file for complete search history.

(56) References Cited

U.S. PATENT DOCUMENTS 5,983,644 A  *  11/1999  Bolandi ............ H01L 21/67103
                                                        62/3.2
8,637,794 B2   1/2014   Singh et al.
(Continued)

FOREIGN PATENT DOCUMENTS

JP            6530220 B2      6/2019
KR   10-2007-0054967 A        5/2007
(Continued)

OTHER PUBLICATIONS

Merriam-Webster Dictionary Definition of distribute retrieved from https://www.merriam-webster.com/dictionary/distribute (Year: 2024).*

(Continued)

*Primary Examiner* — Parviz Hassanzadeh
*Assistant Examiner* — Laureen Chan
(74) *Attorney, Agent, or Firm* — Muir Patent Law, PLLC

(57) ABSTRACT

Disclosed is a plasma processing apparatus comprising a plasma electrode, an electrostatic chuck, and a diode board. The electrostatic chuck includes a microheater layer and a chuck electrode. The microheater layer includes an inner heater part and an outer heater part. The inner heater part includes a first inner heater in a first inner region that circumferentially surrounds a center of the microheater layer, and a second inner heater in a second inner region that circumferentially surrounds the first inner region. The outer heater part includes a first outer heater in a first outer region that circumferentially surrounds the second inner region, and a second outer heater in a second outer region that circumferentially surrounds the first outer region. A distance between centers of the first and second outer heaters is less than that between centers of the first and second inner heaters.

16 Claims, 15 Drawing Sheets

(56) References Cited

U.S. PATENT DOCUMENTS

| | | | |
|---|---|---|---|
| 9,324,589 | B2 | 4/2016 | Pease et al. |
| 9,553,006 | B2 | 1/2017 | Ptasienski et al. |
| 10,049,948 | B2 | 8/2018 | Gaff et al. |
| 10,079,168 | B2 | 9/2018 | Benjamin et al. |
| 10,224,228 | B2 | 3/2019 | Kim et al. |
| 10,332,772 | B2 | 6/2019 | Tantiwong et al. |
| 10,440,777 | B2 | 10/2019 | Zhang et al. |
| 10,522,374 | B2 | 12/2019 | Kim et al. |
| 10,586,686 | B2 | 3/2020 | Nam et al. |
| 2003/0168439 | A1* | 9/2003 | Kanno ............... H01L 21/6831 414/217 |
| 2008/0102001 | A1* | 5/2008 | Chandrachood .. H01J 37/32963 422/129 |
| 2014/0154819 | A1* | 6/2014 | Gaff .................... H01L 22/14 156/345.52 |
| 2016/0345384 | A1* | 11/2016 | Zhang ............. H01L 21/67248 |
| 2016/0358808 | A1* | 12/2016 | Madsen ................. C23C 16/50 |
| 2017/0140957 | A1* | 5/2017 | Kitagawa .......... H01J 37/32724 |
| 2017/0148657 | A1* | 5/2017 | Pape ................. H01L 21/67103 |
| 2017/0215230 | A1* | 7/2017 | Parkhe ............. H01L 21/67248 |
| 2017/0271190 | A1 | 9/2017 | Kim et al. |
| 2017/0309510 | A1* | 10/2017 | Maehata .................. B23Q 3/15 |
| 2019/0013222 | A1* | 1/2019 | Kim ................. H01J 37/32724 |
| 2019/0027344 | A1 | 1/2019 | Okunishi et al. |
| 2019/0153600 | A1* | 5/2019 | Roberts ............ H01L 21/67103 |
| 2020/0037399 | A1 | 1/2020 | Zhang et al. |

FOREIGN PATENT DOCUMENTS

| | | |
|---|---|---|
| KR | 10-2013-0019540 A | 2/2013 |
| KR | 10-2017-0107627 A | 9/2017 |

OTHER PUBLICATIONS (2003). Automation, Systems, and Instrumentation Dictionary (4th Edition). International Society of Automation (ISA). Retrieved from https://app.knovel.com/hotlink/toc/id:kpASIDE005/automation-systems-instrumentation/automation-systems-instrumentation (Year: 2003).*

Roberts, Gordon Taenzler, Friedrich Burns, Mark. (2012). Introduction to Mixed-Signal IC Test and Measurement (2nd Edition). Oxford University Press. pp. 734-735 Retrieved from https://app.knovel.com/hotlink/toc/id:kpIMSICTM4/introduction-mixed-signal/introduction-mixed-signal (Year: 2012).*

* cited by examiner

PLASMA PROCESSING APPARATUS AND SEMICONDUCTOR FABRICATION METHOD USING THE SAME

CROSS-REFERENCE TO RELATED APPLICATION

This U.S. nonprovisional application claims priority under 35 U.S.C § 119 to Korean Patent Application No. 10-2020-0084981 filed on Jul. 9, 2020 in the Korean Intellectual Property Office, the disclosure of which is hereby incorporated by reference in its entire

BACKGROUND

The present inventive concepts relate to a plasma processing apparatus and a semiconductor fabrication method using the same, and more particularly, to a plasma processing apparatus capable of conducting minute or fine control of temperature at a wafer edge and a semiconductor fabrication method using the plasma processing apparatus.

Semiconductor fabrication may be achieved through various processes. The semiconductor fabrication may include, for example, a deposition or etching process performed on a semiconductor wafer. The deposition or etching process on the semiconductor wafer may be executed in a process chamber. The deposition or etching process may be performed to provide the semiconductor wafer with plasma. Various ways may be used to generate the plasma. For example, the plasma may be generated in capacitively coupled plasma (CCP), inductively coupled plasma (ICP), or magnetically enhanced RIE (MERIE) mode. In the CCP or ICP mode, the plasma may be generated from an electric field formed across a region where is present a gas introduced into a process chamber. Between processes that use the plasma, temperature control of a wafer disposed in the process chamber may be desirable.

SUMMARY

Some example embodiments of the present inventive concepts provide a plasma processing apparatus capable of conducting minute control of temperature at an edge of a wafer and a semiconductor fabrication method using the plasma processing apparatus.

Some example embodiments of the present inventive concepts provide a plasma processing apparatus capable of improving distribution of a wafer and a semiconductor fabrication method using the plasma processing apparatus.

Some example embodiments of the present inventive concepts provide a plasma processing apparatus capable of preventing diode and/or control boards from noise caused by an RF supply line and a semiconductor fabrication method using the plasma processing apparatus.

Some example embodiments of the present inventive concepts provide a plasma processing apparatus capable of simply and promptly replacing boards when diode and/or control boards need replacement and a semiconductor fabrication method using the plasma processing apparatus.

Some example embodiments of the present inventive concepts provide a plasma processing apparatus capable of securing symmetry and a semiconductor fabrication method using the plasma processing apparatus.

Some example embodiments of the present inventive concepts provide a plasma processing apparatus capable of easily disassembling and assembling and a semiconductor fabrication method using the plasma processing apparatus.

An object of the present inventive concepts is not limited to those mentioned above, and other objects which have not been mentioned above will be clearly understood to those skilled in the art from the following description.

According to some example embodiments of the present inventive concepts, a plasma processing apparatus may comprise: a plasma electrode; an electrostatic chuck on the plasma electrode; and a diode board below the plasma electrode. The electrostatic chuck may include: a microheater layer to heat a wafer; and a chuck electrode on the microheater layer. The microheater layer may include: an inner heater part on an inside of the microheater layer; and an outer heater part outside the inner heater part. The inner heater part may include: a first inner heater in a first inner region that circumferentially surrounds a center of the microheater layer; and a second inner heater in a second inner region that is outside and circumferentially surrounds the first inner region. The outer heater part may include: a first outer heater in a first outer region that is outside and circumferentially surrounds the second inner region; and a second outer heater in a second outer region that is outside and circumferentially surrounds the first outer region. A distance in a diameter direction between a center of the first outer heater and a center of the second outer heater may be less than a distance in the diameter direction between a center of the first inner heater and a center of the second inner heater.

According to some example embodiments of the present inventive concepts, a plasma processing apparatus may comprise: a plasma electrode; an electrostatic chuck on the plasma electrode; and a diode board below the plasma electrode. The electrostatic chuck may include: a macroheater layer; a microheater layer on the macroheater layer; and a chuck electrode on the microheater layer. The microheater layer may include: an inner heater part on an inside of the microheater layer; and an outer heater part outside the inner heater part. The inner heater part may include a first inner heater in a first inner region that circumferentially surrounds a center of the microheater layer. The outer heater part may include: a first outer heater in a first outer region that is outside and circumferentially surrounds the first inner region; and a second outer heater in a second outer region that is outside and circumferentially surrounds the first outer region. Each of a thickness in a diameter direction of the first outer region and a thickness in the diameter direction of the second outer region may be less than a thickness in the diameter direction of the first inner region.

According to some example embodiments of the present inventive concepts, a semiconductor fabrication method may comprise: placing a wafer on an electrostatic chuck; measuring a temperature of the wafer; and adjusting the temperature of the wafer. The electrostatic chuck may include a microheater layer and a chuck electrode on the microheater layer. The microheater layer may include: a first inner region that circumferentially surrounds a center of the microheater layer; a second inner region that is outside and circumferentially surrounds the first inner region; a first outer region that is outside and circumferentially surrounds the second inner region; and a second outer region that is outside and circumferentially surrounds the first outer region. A thickness in a diameter direction of the first outer region and a thickness in the diameter direction of the second outer region may be less than a thickness in the diameter direction of the first inner region and a thickness in the diameter direction of the second inner region. The step of adjusting the temperature of the wafer may include: controlling a temperature of the first outer region to a first temperature; and controlling a temperature of the second outer region to a second temperature. The second temperature may be distinguished from the first temperature.

Details of other example embodiments are included in the description and drawings.

DETAILED DESCRIPTION OF EMBODIMENTS

Figure 1:
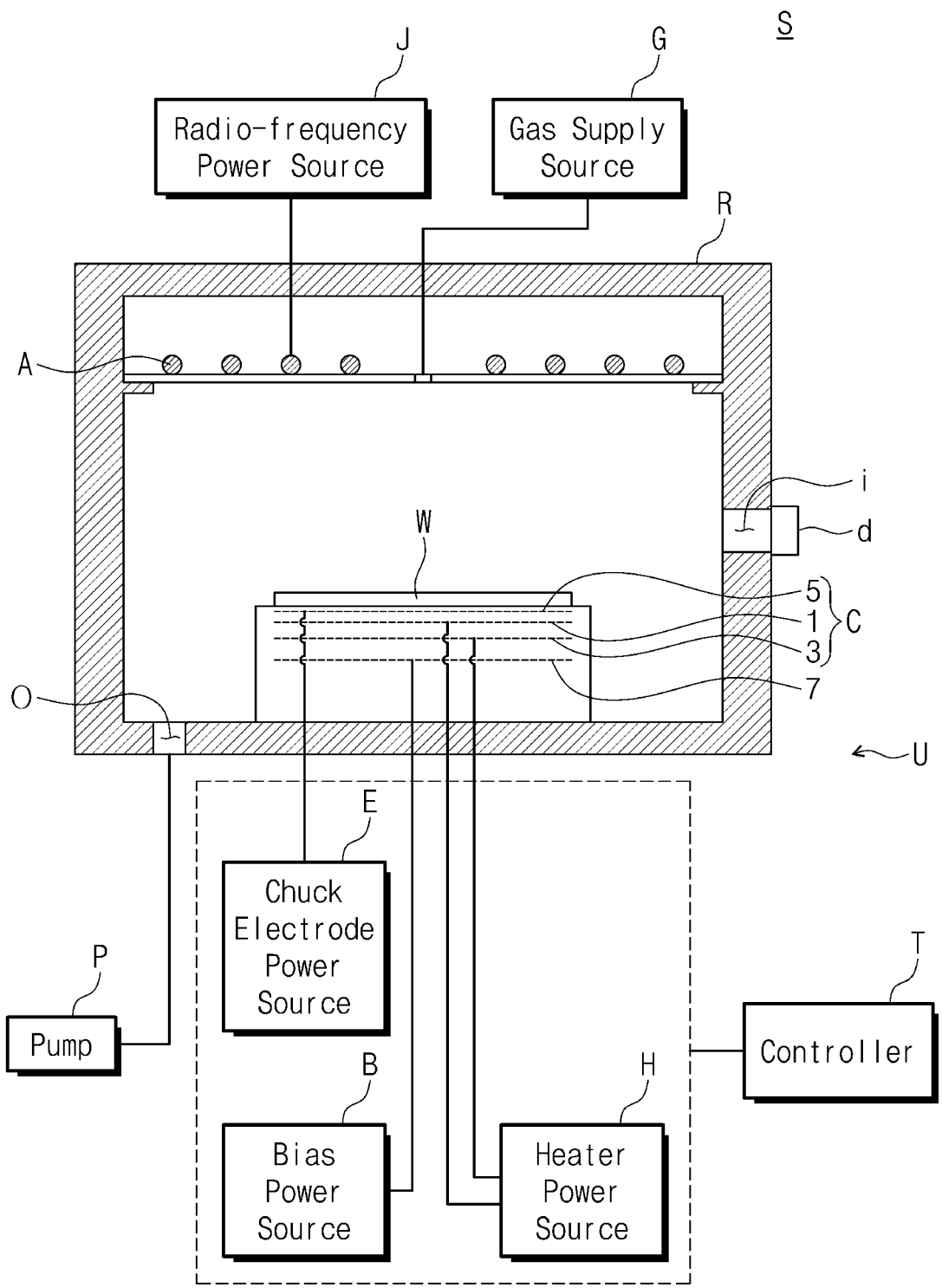
FIG. 1 illustrates a schematic diagram showing a plasma chamber including a plasma processing apparatus according to some example embodiments of the present inventive concepts.

The following will now describe some example embodiments of the present inventive concepts with reference to the accompanying drawings. Like reference numerals may indicate like components throughout the description.

FIG. 1 illustrates a schematic diagram showing a plasma chamber including a plasma processing apparatus according to some example embodiments of the present inventive concepts.

Referring to FIG. 1, a plasma treatment system S may be provided. The plasma treatment system S may include a plasma chamber R, a radio-frequency power source J, a gas supply source G, and a plasma processing apparatus U.

The plasma chamber R may provide a space where plasma processes are performed. The plasma processes may mean plasma-using processes of semiconductor processes. For example, the plasma processes may include a deposition or etching process performed on a semiconductor wafer. The plasma chamber R may generate plasma by using capacitively coupled plasma (CCP), inductively coupled plasma (ICP), or magnetically enhanced RIE (MERIE) mode. The following description will focus on the plasma process based on the ICP mode for the purpose of convenience of explanation. A wafer W may be disposed in the plasma chamber R. For example, the wafer W may be placed on the plasma processing apparatus U. The wafer W may be inserted through a chamber entrance i into the plasma chamber R. The plasma chamber R may be isolated from outside through a door d installed nearby the chamber entrance i. Under a state where the plasma chamber R is isolated from outside, the wafer W may undergo a process that uses generated plasma. The plasma chamber R may have an exhaust O. The exhaust O may be coupled to a pump P. A negative pressure provided from the pump P may allow the plasma chamber R to discharge gases through the exhaust O. The plasma chamber R may be coupled to the gas supply source G. The gas supply source G may supply the plasma chamber R with a reaction gas. The plasma chamber R may further include an antenna electrode A therein. The antenna electrode A may receive a radio-frequency power from the radio-frequency power source J.

The radio-frequency power source J may be coupled to the antenna electrode A. The radio-frequency power source J may provide the antenna electrode A with the radio-frequency power. The radio-frequency power supplied from the radio-frequency power source J may allow the antenna electrode A to excite the reaction gas into a plasma state.

The gas supply source G may supply the plasma chamber R with a reaction gas. The antenna electrode A may generate plasma from the reaction gas supplied into the plasma chamber R. The wafer W may undergo a process that uses plasma produced by the antenna electrode A.

The plasma processing apparatus U may include an electrostatic chuck C, a plasma electrode 7, a chuck electrode power source E, a bias power source B, a heater power source H, and a controller T. The electrostatic chuck C may load the wafer W thereon. A plasma process may be performed on the wafer W that is loaded on the electrostatic chuck C. The electrostatic chuck C may include a chuck electrode 5, a microheater layer 1 (i.e., a first heater layer), and a macroheater layer 3 (i.e., a second heater layer). The chuck electrode 5 may fix the wafer W. The chuck electrode 5 may be coupled to the chuck electrode power source E. The microheater layer 1 may heat the wafer W. In some example embodiments, the microheater layer 1 may be positioned below the chuck electrode 5. The microheater layer 1 may be coupled to the heater power source H. The macroheater layer 3 may heat the wafer W. In some example embodiments, the macroheater layer 3 may be positioned below the microheater layer 1. The macroheater layer 3 may be coupled to the heater power source H. The plasma electrode 7 may be positioned below the electrostatic chuck C. In some example embodiments, the plasma electrode 7 may be coupled to the bias power source B. The plasma electrode 7 may receive a radio-frequency power from the bias power source B. The plasma electrode 7 may receive the radio-frequency power to move the plasma. For example, the plasma electrode 7 may be a bias electrode. The plasma electrode 7 may have a cooling channel 7ch. The cooling channel 7ch may be shaped like a concentric circle in the plasma electrode 7. The cooling channel 7ch may be supplied with cooling water. The cooling water flowing through the cooling channel 7ch may cool the electrostatic chuck C. The chuck electrode power source E may provide the chuck electrode 5 with an electrostatic voltage. The electrostatic voltage provided from the chuck electrode power source E may allow the chuck electrode 5 to fix the wafer W. The bias power source B may provide the plasma electrode 7 with the radio-frequency power. The radio-frequency power provided from the bias power source B may allow the plasma electrode 7 to apply a bias voltage to the wafer W. The heater power source H may provide the microheater layer 1 and/or the macroheater layer 3 with heater power. The heater power provided from the heater power source H may allow the microheater layer 1 and/or the macroheater layer 3 to heat the wafer W. The controller T may control the chuck electrode power source E, the bias power source B, and the heater power source H. The following will describe in detail the plasma processing apparatus U with reference to FIGS. 2 to 15. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 2:
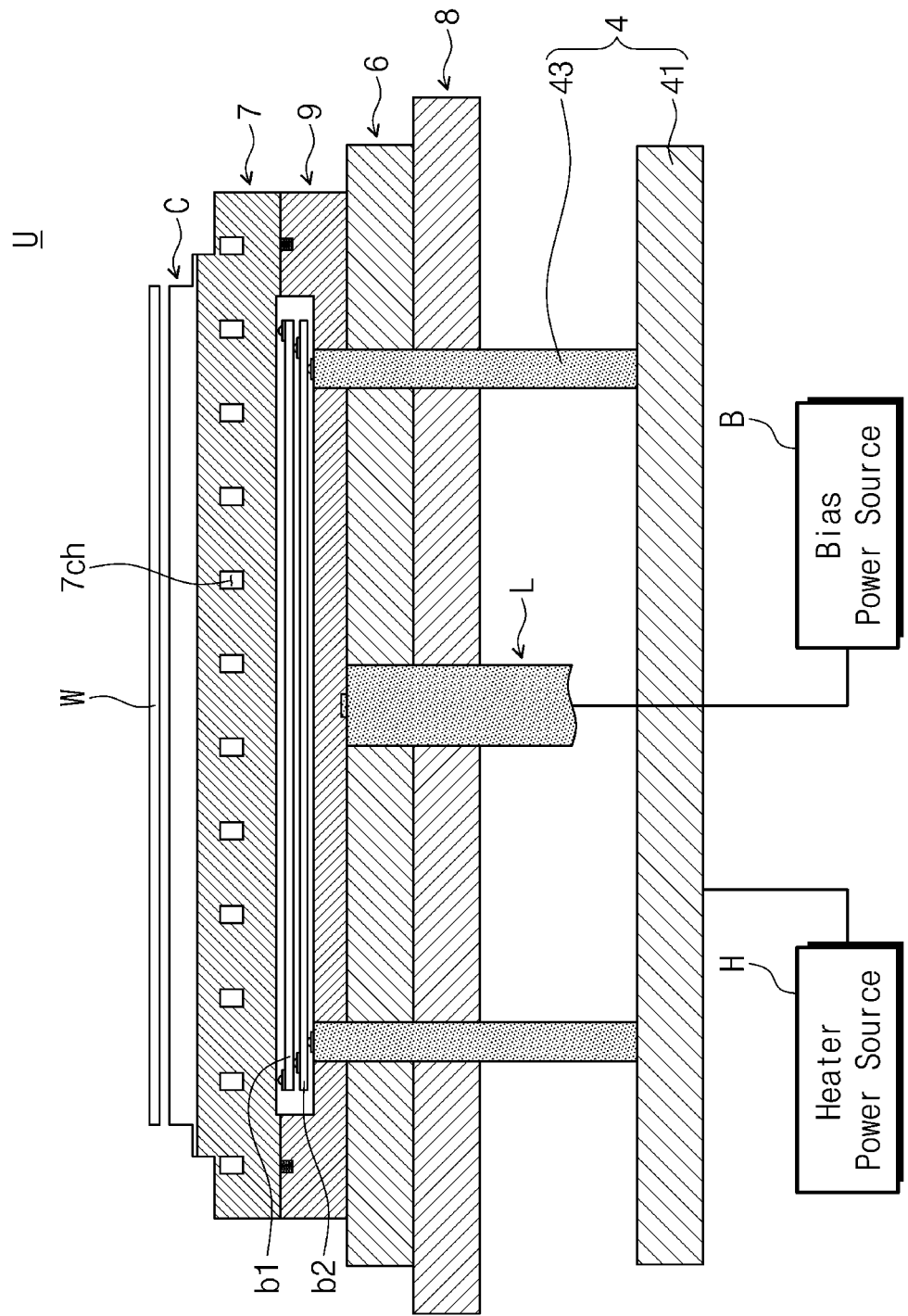
FIG. 2 illustrates a cross-sectional view showing a plasma processing apparatus according to some example embodiments of the present inventive concepts.

FIG. 2 illustrates a cross-sectional view showing a plasma processing apparatus according to some example embodiments of the present inventive concepts.

Referring to FIG. 2, the plasma processing apparatus U may include an electrostatic chuck C, a plasma electrode 7, a diode board b1, a control board b2, a distribution member 9, an isolator 6, a ground plate 8, a supply line L, and a heater power transmitter 4.

The electrostatic chuck C may fix the wafer W. The electrostatic chuck C may be positioned on the plasma electrode 7. The electrostatic chuck C will be further discussed in detail below with reference to FIG. 3.

The plasma electrode 7 may be disposed below the electrostatic chuck C. The plasma electrode 7 may be connected to the bias power source B through the distribution member 9 and the supply line L. A radio-frequency power provided from the bias power source B may be transmitted to the plasma electrode 7 through the supply line L and the distribution member 9.

The diode board b1 and the control board b2 may receive heater power from the heater power source H. The diode board b1 and the control board b2 may be positioned between the plasma electrode 7 and the distribution member 9. The diode board b1 and the control board b2 will be further discussed below in detail with reference to FIGS. 10 to 13.

The distribution member 9 may be positioned between the isolator 6 and the plasma electrode 7. The distribution member 9 may be connected to the bias power source B. The distribution member 9 may receive a bias power through the supply line L from the bias power source B. The distribution member 9 may transmit the bias power to the plasma electrode 7. In some example embodiments, the distribution member 9 may include a conductive material. For example, the distribution member 9 may include copper (Cu). The present inventive concepts, however, are not limited thereto.

The isolator 6 may be positioned between the distribution member 9 and the ground plate 8. The isolator 6 may include a dielectric material. Components above the isolator 6 may be electrically separated from components below the isolator 6.

The ground plate 8 may be positioned below the isolator 6. The ground plate 8 may be electrically grounded.

The supply line L may be connected to the distribution member 9. For example, the supply line L may be coupled to a center of a bottom surface of the distribution member 9. The supply line L may provide the distribution member 9 with the radio-frequency power received from the bias power source B. In some example embodiments, the supply line L may include a conductive material. For example, the supply line L may include copper (Cu).

The heater power transmitter 4 may be connected to the heater power source H. The heater power transmitter 4 may provide the diode board b1 and/or the control board b2 with the heater power received from the heater power source H. A portion of the heater power transmitter 4 may penetrate the distribution member 9, the isolator 6, and the ground plate 8.

With reference to FIGS. 8 to 15, the following will describe the diode board b1, the control board b2, the distribution member 9, the isolator 6, the ground plate 8, and the supply line L.

Figure 3:
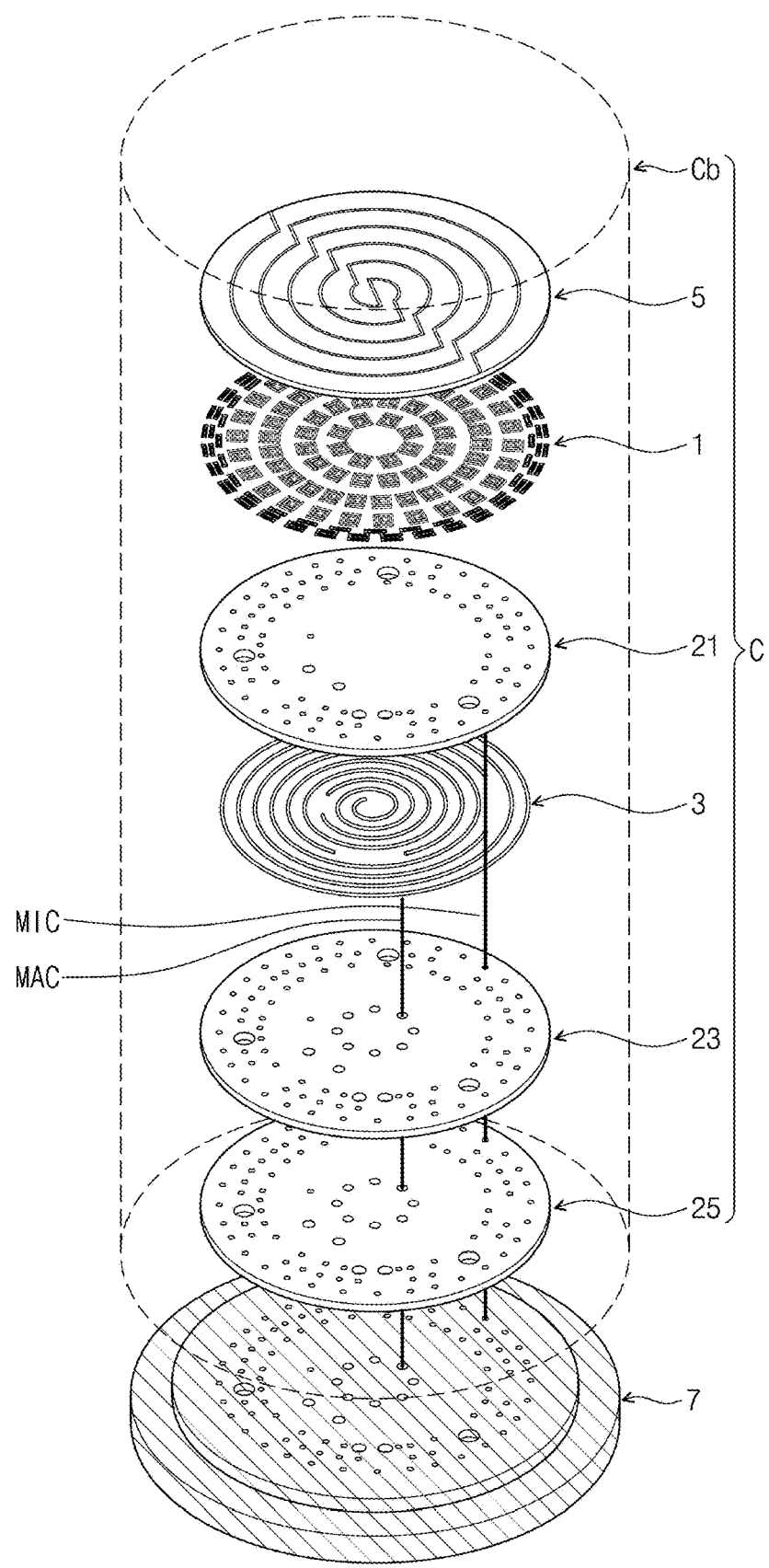
FIG. 3 illustrates an exploded perspective view partially showing a plasma processing apparatus according to some example embodiments of the present inventive concepts.

FIG. 3 illustrates an exploded perspective view partially showing a plasma processing apparatus according to some example embodiments of the present inventive concepts.

Referring to FIG. 3, the electrostatic chuck C may be provided on the plasma electrode 7. The electrostatic chuck C may include a chuck body Cb, a chuck electrode 5, a microheater layer 1 (i.e., a first heater), an upper electrode layer 21, a macroheater layer 3 (i.e., a second heater), a lower electrode layer 23, and a ground layer 25.

The chuck body Cb may have a disk shape with a certain thickness. The chuck body Cb may form an overall appearance of the electrostatic chuck C. The chuck body Cb may be positioned on the plasma electrode 7. The chuck body Cb may fix the chuck electrode 5, the microheater layer 1, the upper electrode layer 21, the macroheater layer 3, the lower electrode layer 23, and the ground layer 25. For example, the chuck body Cb may have therein the chuck electrode 5, the microheater layer 1, the upper electrode layer 21, the macroheater layer 3, the lower electrode layer 23, and the ground layer 25. The chuck body Cb may include a ceramic material. In an exemplary embodiment, the chuck body Cb may be formed of a ceramic material. The wafer W may be disposed on a top surface of the chuck body Cb.

The chuck electrode 5 may be positioned in the chuck body Cb. The chuck electrode 5 may be electrically connected to the chuck electrode power source (see E of FIG. 1). The chuck electrode 5 may receive from the chuck electrode power source E an electrostatic voltage to fix the wafer W. For example, the chuck electrode 5 may receive from the chuck electrode power source E an electrostatic voltage of about 2,500 V to fix the wafer W onto the electrostatic chuck C. The chuck electrode 5 may be electrically connected to the ground layer 25. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The microheater layer 1 may be positioned in the chuck body Cb. The microheater layer 1 may be placed below the chuck electrode 5. For example, the chuck electrode 5 may be disposed on the microheater layer 1. The microheater layer 1 may be electrically connected to the heater power source (see H of FIG. 1). For example, the microheater layer 1 may be supplied through the upper electrode layer 21 with the heater power from the heater power source H. The microheater layer 1 may heat the wafer W. The microheater layer 1 may include a plurality of heaters. Each of the heaters included in the microheater layer 1 may include a conductive material. For example, each of the plurality of heaters included in the microheater layer 1 may include an alloy of nickel and chromium. In some example embodiments, the microheater layer 1 may minutely or finely adjust a temperature at each point of the wafer W. The plurality of heaters included in the microheater layer 1 may be arranged to form a circular shape when viewed in plan view. A detailed description thereof will be further discussed below with reference to FIGS. 4 to 7.

The upper electrode layer 21 may be positioned in the chuck body Cb. The upper electrode layer 21 may be placed below the microheater layer 1. The upper electrode layer 21 may be electrically connected to the heater power source (see H of FIG. 1). The upper electrode layer 21 may provide the microheater layer 1 with the heater power supplied from the heater power source H. For example, the upper electrode layer 21 may divide the heater power supplied from the heater power source H, and then may transfer the divided power to each of the plurality of heaters included in the microheater layer 1. The upper electrode layer 21 may be electrically connected to the ground layer 25.

The macroheater layer 3 may be positioned in the chuck body Cb. The macroheater layer 3 may be placed below the upper electrode layer 21. For example, the upper electrode layer 21 may be disposed on the macroheater layer 3. The macroheater layer 3 may be electrically connected to the heater power source (see H of FIG. 1). For example, the macroheater layer 3 may be supplied through the lower electrode layer 23 with the heater power from the heater power source H. The macroheater layer 3 may heat the wafer W. The macroheater layer 3 may include a plurality of heaters. Each of the plurality of heaters included in the macroheater layer 3 may include a conductive material such as an alloy of nickel and chromium. Each of the plurality of heaters may extend in a circumferential direction. The plurality of heaters may be spaced apart from each other in a diameter direction. In some example embodiments, the macroheater layer 3 may roughly adjust a temperature of the wafer W.

The lower electrode layer 23 may be positioned in the chuck body Cb. The lower electrode layer 23 may be placed below the macroheater layer 3. The lower electrode layer 23 may be electrically connected to the heater power source (see H of FIG. 1). The lower electrode layer 23 may provide the macroheater layer 3 with the heater power supplied from the heater power source H. For example, the lower electrode layer 23 may divide the heater power supplied from the heater power source H, and then may transfer the divided power to each of the plurality of heaters included in the macroheater layer 3. The lower electrode layer 23 may be electrically connected to the ground layer 25.

The ground layer 25 may be positioned in the chuck body Cb. The ground layer 25 may be placed below the lower electrode layer 23. The ground layer 25 may include a conductive material. For example, the ground layer 25 may include a metal disk. The ground layer 25 may electrically ground the chuck electrode 5, the upper electrode layer 21, and the lower electrode layer 23.

Figure 4:
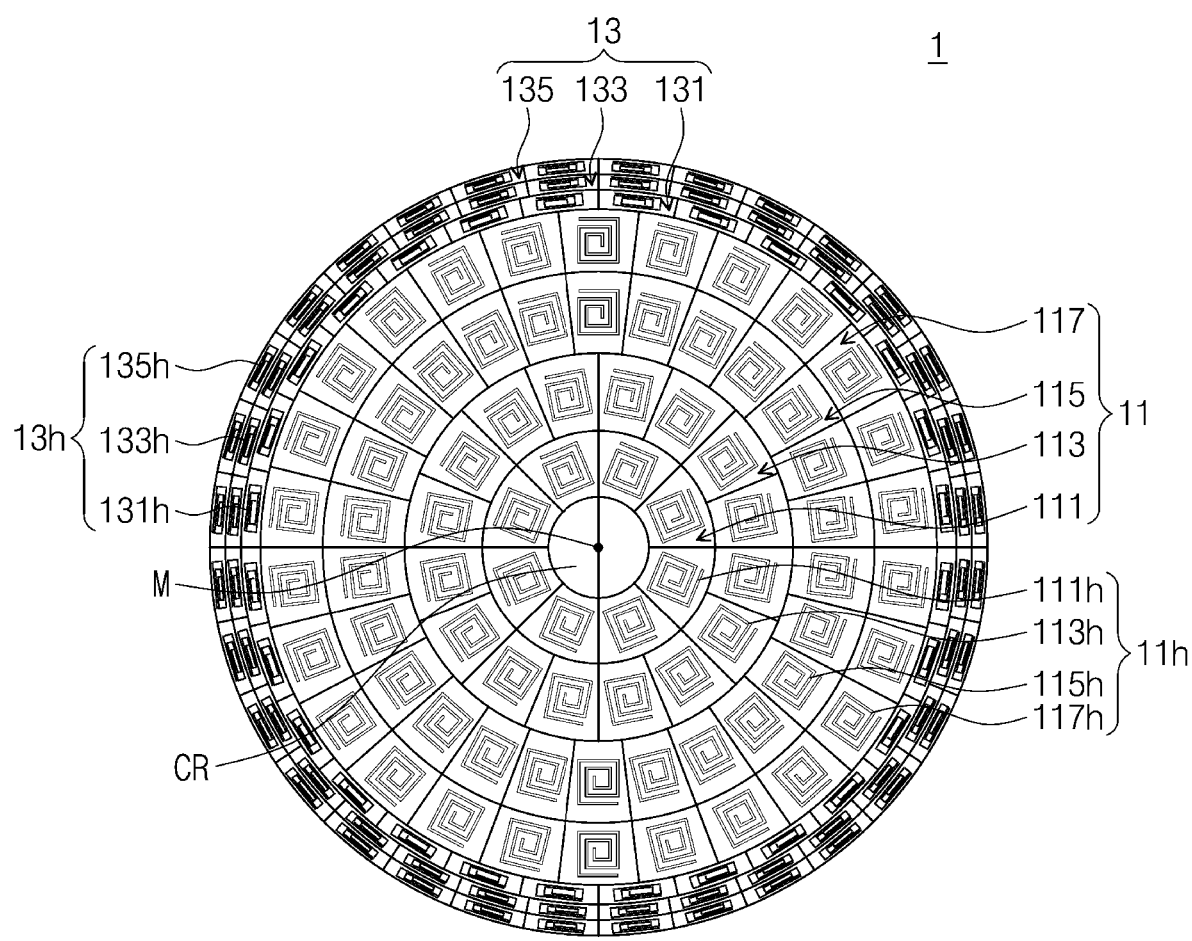
FIG. 4 illustrates a plan view showing a microheater layer of an electrostatic chuck according to some example embodiments of the present inventive concepts.
Figure 5:
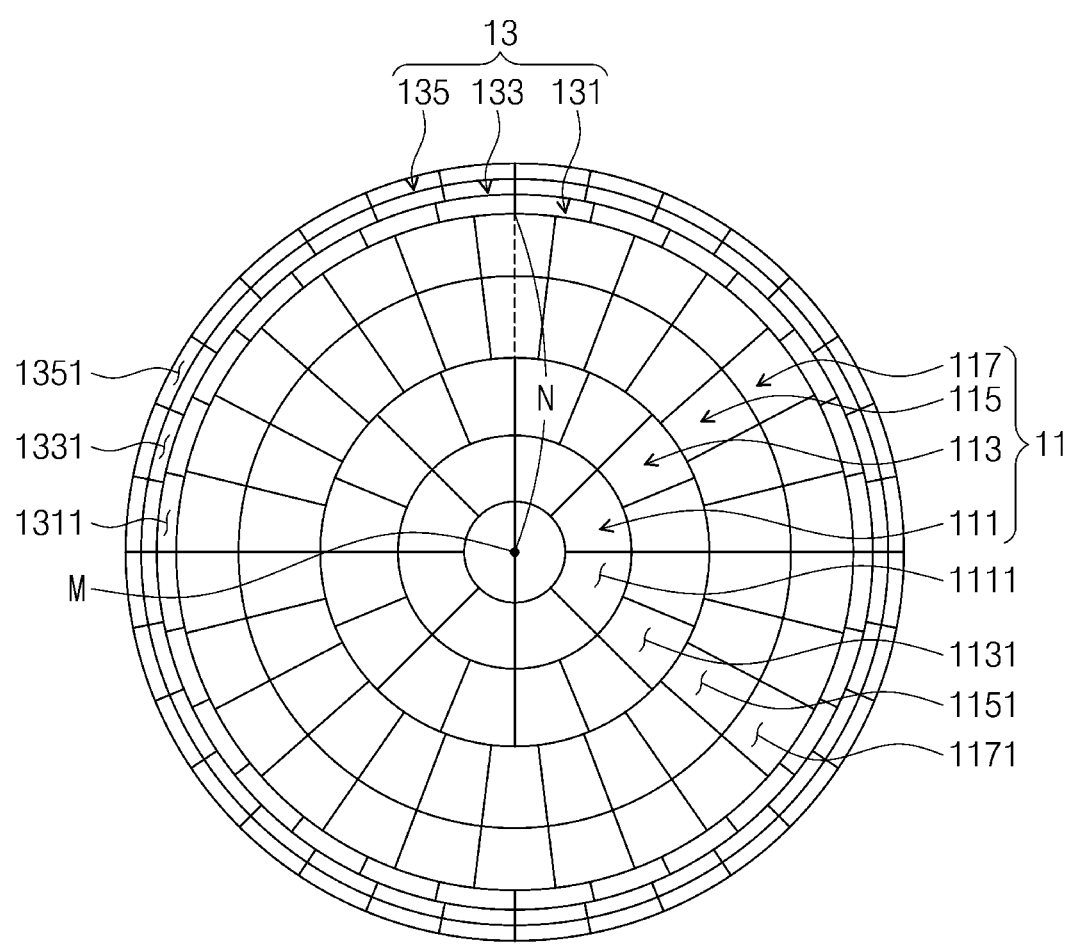
FIG. 5 illustrates a plan view showing a microheater layer from which heaters are removed to explain a region division according to some example embodiments of the present inventive concepts.

FIG. 4 illustrates a plan view showing a microheater layer of an electrostatic chuck according to some example embodiments of the present inventive concepts. FIG. 5 illustrates a plan view showing a microheater layer from which heaters are removed to explain a region division according to some example embodiments of the present inventive concepts.

Referring to FIG. 4, the microheater layer 1 may be divided into a central region CR, an inner region 11 and an outer region 13. The central region CR may be positioned at a center M with a predetermined radius. The inner region 11 may be of an annular shape and surround the center region CR. The outer region 13 may be of an annular shape and surround the inner region 11. In an exemplary embodiment, the central region CR, the inner region 11, and the outer region 13 may be concentric with respect to the center M.

The inner region 11 may mean an area adjacent to an inner side of the microheater layer 1. For example, the inner region 11 may indicate an area including the center M of the microheater layer 1. The microheater layer 1 may be shaped like a circle, and the center M may denote either a center of the circle or a point near the center of the circle. The inner region 11 may be divided into a plurality of inner annular regions including a first inner region 111 (i.e., a first inner annular region), a second inner region 113 (i.e., a second inner annular region), a third inner region 115 (i.e., a third inner annular region), and a fourth inner region 117 (i.e., a fourth inner annular region). When viewed in plan view, the first inner region 111 may circumferentially surround the central region CM of the microheater layer 1, and may abut the central region CM. For example, the first inner region 111 may correspond to an annular region with an inner circle of a first inner distance from the center M (i.e., a first radius) and an outer circle of a second inner distance from the center M (i.e., a second radius) which is greater than the first inner distance. The inner circle of the first inner region 111 may correspond to a boundary between the first inner region 111 and the central region CM. The first radius of the first inner region may correspond to the radius of the central region CM. When viewed in plan view, the second inner region 113 may be outside the first inner region 111 and may circumferentially surround the first inner region 111. For example, the second inner region 113 may correspond to an annular region with an inner circle of the second inner distance (i.e., the second radius) and an outer circle of a third inner distance from the center M (i.e., a third radius) which is greater than the second radius. The inner circle of the second inner region 113 may correspond to a boundary between the second inner region 113 and the first inner region 111. The third inner region 115 may be outside the second inner region 113 and may circumferentially surround the second inner region 113. For example, the third inner region 115 may correspond to an annular region with an inner circle of the third inner distance (i.e., the third radius) and an outer circle of a fourth inner distance from the center M (i.e., a fourth radius) which is greater than the third radius. The inner circle of the third inner region 115 may correspond to a boundary between the third inner region 115 and the second inner region 113. The fourth inner region 117 may be outside the third inner region 115 and may circumferentially surround the third inner region 115. For example, the fourth inner region 117 may correspond to an annular region with an inner circle of the fourth inner distance (i.e., the fourth radius) and an outer circle of a fifth radius from the center M (i.e., a fifth radius) which is greater than the fourth radius. The inner circle of the fourth inner region 117 may correspond to a boundary between the fourth inner region 117 and the third inner region 115. It is explained that the inner region 11 is divided into four regions, or the first, second, third, and fourth inner regions 111, 113, 115, and 117, but this is merely one embodiment to facilitate the understanding of the present inventive concepts, and the inner region 11 may be divided into one, two, three, five, or more than five regions. The case where the inner region 11 is divided into one region may mean that the inner region 11 and the first inner region 111 are substantially the same as each other. Referring to FIG. 5, the first inner region 111 may be divided along the circumferential direction into a plurality of first fine inner regions 1111 (i.e., a plurality of first sub inner regions). Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. The first fine inner regions 1111 may correspond to a plurality of sectors that are divided along the circumferential direction. For example, the first inner region 111 may be divided into eight first fine inner regions 1111. In an exemplary embodiment, the first fine inner regions 1111 may be equally divided in the first inner region 111 along the circumferential direction, and each of the first fine inner regions 1111 may have the same inner arc length and the same outer arc length. Likewise, the second inner region 113 may be divided along the circumferential direction into a plurality of second fine inner regions 1131 (i.e., a plurality of second sub inner regions). For example, the second inner region 113 may be divided into sixteen second fine inner regions 1131. In an exemplary embodiment, the second fine inner regions 1131 may be equally divided in the second inner region 113 along the circumferential direction, and each of the second fine inner regions 1131 may have the same inner arc length and the same outer arc length. The third inner region 115 may be divided along the circumferential direction into a plurality of third fine inner regions 1151 (i.e., a plurality of third sub inner regions). For example, the third inner region 115 may be divided into twenty-six third fine inner regions 1151. In an exemplary embodiment, the third fine inner regions 1151 may be equally divided in the third inner region 115 along the circumferential direction, and each of the third fine inner regions 1151 may have the same inner arc length and the same outer arc length. The fourth inner region 117 may be divided along the circumferential direction into a plurality of fourth fine inner regions 1171 (i.e., a plurality of fourth sub inner regions). For example, the fourth inner region 117 may be divided into twenty-six fourth fine inner regions 1171. In an exemplary embodiment, the fourth fine inner regions 1171 may be equally divided in the fourth inner region 117 along the circumferential direction, and each of the fourth fine inner regions 1171 may have the same inner arc length and the same outer arc length.

Referring back to FIG. 4, when viewed in plan view, the outer region 13 may correspond to an area that surrounds the inner region 11. For example, the outer region 13 may correspond to an outer annular region that is outside the inner region 11 and is distant away from the center M of the microheater layer 1. The outer region 13 may be divided into a plurality of outer annular regions including a first outer region 131 (i.e., a first outer annular region), a second outer region 133 (i.e., a second outer annular region), and a third outer region 135 (i.e., a third outer annular region). When viewed in plan view, the first outer region 131 may circumferentially surround the fourth inner region 117. For example, the first outer region 131 may correspond to an area defined between a first outer distance from the center M and a second outer distance from the center M. In some example embodiments, when the inner region 11 is divided into four regions and the first outer region 131 abuts fourth inner region 117, the first outer region 131 may correspond to an annular region with an inner circle of the fifth radius and an outer circle of a sixth radius which is greater than the fifth radius. The inner circle of the first outer region 131 may correspond to a boundary between the first outer region 131 and the fourth inner region 117. The fifth inner distance (i.e., the fifth radius) and the first outer distance may be substantially the same as or similar to each other. The second outer distance may correspond to the sixth radius. When viewed in plan view, the second outer region 133 may be outside the first outer region 131 and may circumferentially surround the first outer region 131. For example, the second outer region 133 may correspond to an annular region with an inner circle of the second outer distance (i.e., the sixth radius) and an outer circle of a third outer distance from the center M (i.e., a seventh radius) which is greater than the second outer distance. The third outer region 135 may be outside the second outer region 133 and may circumferentially surround the second outer region 133. For example, the third outer region 135 may correspond to an annular region with an inner circle of the third outer distance (i.e., the seventh radius) and an outer circle of a fourth outer distance from the center M (i.e., an eighth radius) which is greater than the third outer distance. It is discussed above that the outer region 13 is divided into three regions, or the first, second, and third outer regions 131, 133, and 135, but this is a merely example to facilitate the understanding of the present inventive concepts, and the outer region 13 may be divided into two, four, or more than four regions. Referring back to FIG. 5, the first outer region 131 may be divided into a plurality of first fine outer regions 1311 (i.e., a plurality of first sub outer regions) along the circumferential direction. The first fine outer regions 1311 may correspond to sectors that are divided along the circumferential direction. For example, the first outer region 131 may be divided into twenty-eight first fine outer regions 1311. In an exemplary embodiment, the first fine outer regions 1311 may be equally divided in the first outer region 131 along the circumferential direction, and each of the first fine outer regions 1311 may have the same inner arc length and the same outer arc length. Likewise, the second outer region 133 may be divided into a plurality of second fine outer regions 1331 (i.e., a plurality of second sub outer regions) along the circumferential direction. For example, the second outer region 133 may be divided into thirty-two second fine outer regions 1331. In an exemplary embodiment, the second fine outer regions 1331 may be equally divided in the second outer region 133 along the circumferential direction, and each of the second fine outer regions 1331 may have the same inner arc length and the same outer arc length. The third outer region 135 may be divided into a plurality of third fine outer regions 1351 (i.e., a plurality of third sub outer regions) along the circumferential direction. For example, the third outer region 135 may be divided into thirty-two third fine outer regions 1351. In an exemplary embodiment, the third fine outer regions 1351 may be equally divided in the third outer region 135 along the circumferential direction, and each of the third fine outer regions 1351 may have the same inner arc length and the same outer arc length.

Referring again to FIG. 4, the microheater layer 1 may include an inner heater part 11h (i.e., a first heater) and an outer heater part 13h (i.e., a second heater). The inner heater part 11h and the outer heater part 13h may be connected to the heater power source (see H of FIG. 1). For example, the inner heater part 11h and the outer heater part 13h may be connected through the upper electrode layer (see 21 of FIG. 3) to the heater power source H. The inner heater part 11h and the outer heater part 13h may be supplied with the heater power from the heater power source H.

The inner heater part 11h may be positioned on the inner region 11. For example, the inner heater part 11h may be placed on an inside of the microheater layer 1. The inner heater part 11h may include a plurality of first inner heaters 111h, a plurality of second inner heaters 113h, a plurality of third inner heaters 115h, and a plurality of fourth inner heaters 117h. The first inner heaters 111h may be positioned in the first inner region 111. When the first inner region 111 is divided into a plurality of first fine inner regions (see 1111 of FIG. 5), each of the first inner heaters 111h may be provided in a corresponding one of the plurality of first fine inner regions 1111. In an exemplary embodiment, each of the first inner heaters 111h may be of a spiral shape. For example, each first inner heater 111h may wind around a center of the spiral shape, extending in a in straight line and turning at 90°, for example, to form the spiral shape. This description of the spiral shape will be applied to the remaining inner heaters and the outer heaters, though the shape is limited as such and may include curved spiral shapes. In some example embodiments, when the first inner region 111 is formed of a single region, a single first inner heater 111h may be a band-type heater that circumferentially surrounds the entirety or almost the entirety of the center M of the microheater layer 1. The second inner heaters 113h may be positioned in the second inner region 113. When the second inner region 113 is divided into a plurality of second fine inner regions (see 1131 of FIG. 5), each of the second inner heaters 113h may be provided in a corresponding one of the plurality of second fine inner regions 1131. Likewise, the third inner heaters 115h and the fourth inner heaters 117h may be respectively positioned in the third inner region 115 and the fourth inner region 117.

The outer heater part 13h may be positioned on the outer region 13. The outer heater part 13h may be positioned outside the inner heater part 11h. The outer heater part 13h may include a plurality of first outer heaters 131h, a plurality of second outer heaters 133h, and a plurality of third outer heaters 135h. The first outer heaters 131h may be positioned in the first outer region 131. When the first outer region 131 is divided into a plurality of first fine outer regions (see 1311 of FIG. 5), each of the first outer heaters 131h may be provided in a corresponding one of the plurality of first fine outer regions 1311. The second outer heaters 133h may be positioned in the second outer region 133. When the second outer region 133 is divided into a plurality of second fine outer regions (see 1331 of FIG. 5), each of the second outer heaters 133h may be provided in a corresponding one of the plurality of second fine outer regions 1331. Likewise, the third outer heaters 135h may be positioned in the third outer region 135.

Referring again to FIG. 5, an outer boundary distance N may correspond to a distance (i.e., a radius) in the diameter direction between the first outer region 131 and the center M of the microheater layer 1. For example, the outer boundary distance N may correspond to the first outer distance. In some example embodiments, the outer boundary distance N may range from about 120 mm to about 130 mm. For example, the outer boundary distance N may be about 125 mm. The present inventive concepts, however, are not limited thereto.

Figure 6:
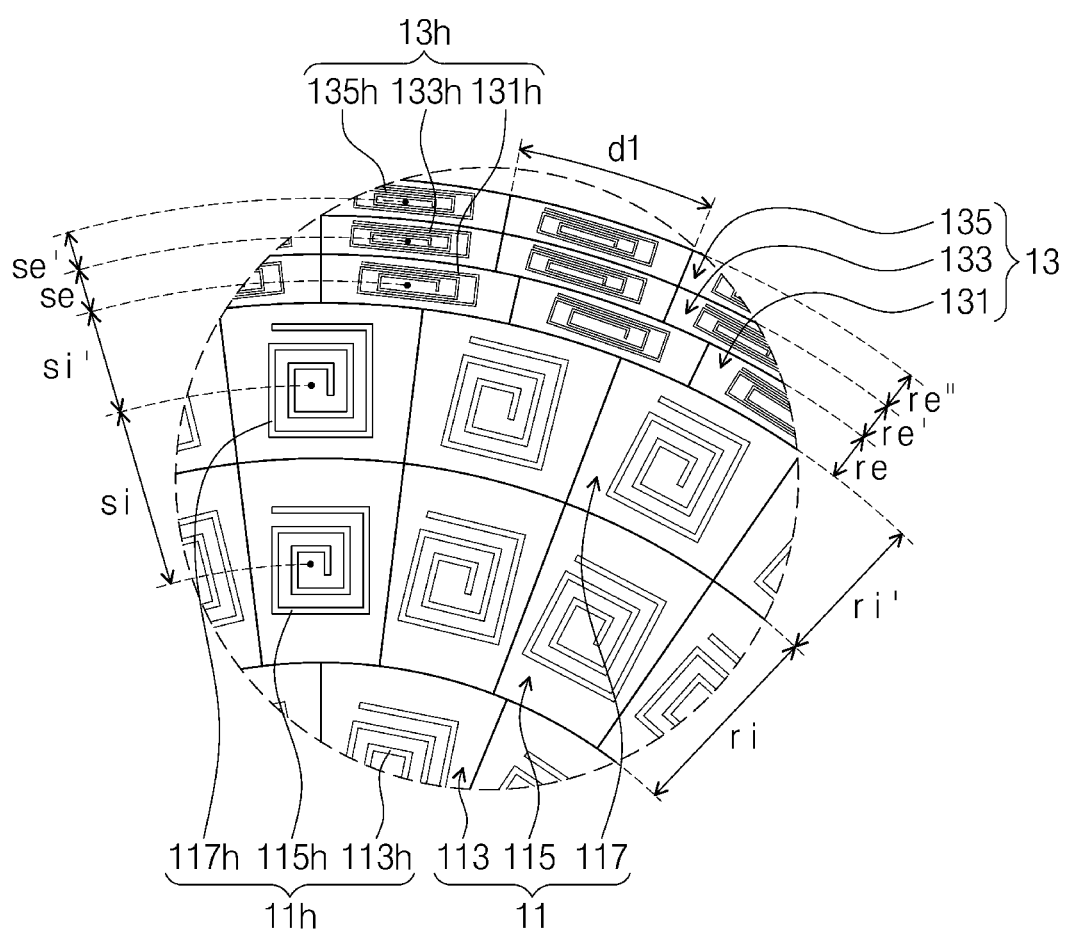
FIG. 6 illustrates an enlarged plan view showing a portion of FIG. 4.

FIG. 6 illustrates an enlarged plan view showing a portion of FIG. 4.

Referring to FIG. 6, a thickness in the diameter direction of the third inner region 115 may be called a third inner thickness ri (i.e., a third inner annular width). For example, the third inner thickness ri may correspond to a difference between the fourth inner distance (i.e., the fourth radius) and the third inner distance (i.e., the third radius). A thickness in the diameter direction of the fourth inner region 117 may be called a fourth inner thickness ri' (i.e., a fourth inner annular width). For example, the fourth inner thickness ri' may correspond to a difference between the fifth inner distance (i.e., the fifth radius) and the fourth inner distance (i.e., the fourth radius). Although not shown in FIG. 6, a thickness in the diameter direction of the first inner region (see 111 of FIG. 5) may be called a first inner thickness (i.e., a first inner annular width). For example, the first inner thickness may correspond to a difference between the second inner distance (i.e., the second radius) and the first inner distance (i.e., the first radius). A thickness in the diameter direction of the second inner region 113 may be called a second inner thickness (i.e., a second inner annular width). For example, the second inner thickness may correspond to a difference between the third inner distance (i.e., the third radius) and the second inner distance (i.e., the second radius). A third inner spacing distance si may correspond to a distance in the diameter direction between a center of the third inner heater 115h and a center of the fourth inner heater 117h. In an exemplary embodiment, the third inner spacing distance si may correspond to a third radial distance which is the shortest distance between an imaginary circular line on which the center of the third inner heater 115h is located and an imaginary circular line on which the center of the fourth inner heater 117h is located. The imaginary circular lines may be concentric with respect to the center M of the microheater layer 1. A fourth inner spacing distance si' may correspond to a distance in the diameter direction between the center of the fourth inner heater 117h and a center of the first outer heater 131h. In an exemplary embodiment, the fourth inner spacing distance si' may correspond to a fourth radial distance which is the shortest distance between an imaginary circular line on which the center of the fourth inner heater 117h is located and an imaginary circular line on which the center of the first outer heater 131h. The imaginary circular lines may be concentric with respect to the center M of the microheater layer 1. Although not shown in FIG. 6, a first inner spacing distance may correspond to a distance in the diameter direction between a center of the first inner heater 111*h* and a center of the second inner heater 113*h*, and a second inner spacing distance may correspond to a distance in the diameter direction between the center of the second inner heater 113*h* and the center of the third inner heater 115*h*. In some example embodiments, the term "center of a heater" may mean a barycenter of an area occupied by the heater in a plan view.

In an exemplary embodiment, the fourth inner heater 117*h*, which is positioned in the outermost inner region (e.g., the fourth inner region 117) of the inner region 11, may occupy a first area which is greater than a second area occupied by the first outer heater 131*h*, which is positioned in the innermost outer region (e.g., the first outer region 131) of the outer region 13. In an exemplary embodiment, the other inner heaters 111*h*, 113*h*, and 115*h* of the inner heater part 11*h* may occupy substantially the same area as the first area occupied by the fourth inner heater 117*h*. The present inventive concepts are not limited thereto. At least one of the other inner heaters 111*h*, 113*h*, and 115*h* may occupy an area which is different from the first area occupied by the fourth inner heater 117*h*, and which is greater than the second area occupied by the first outer heater 131*h*.

In an exemplary embodiment, the other outer heaters 133*h* and 135*h* of the outer heater part 13*h* may occupy substantially the same area as the second area occupied by the first outer heater 131*h*. The present inventive concepts are not limited thereto. At least one of the other outer heaters 133*h* and 135*h* may occupy an area which is different from the second area occupied by the first outer heater 131*h*, and which is smaller than the second area occupied by the first outer heater 131*h*. The term "area" occupied by a heater may refer to an area covered by a shape formed by outermost boundaries of the heater. For example, when circumference of one heater has a rectangular shape when viewed in plan view, a center of the heater may mean a barycenter of the rectangular shape. In some example embodiments, when the first inner region 111 is not divided into a plurality of first fine inner regions 1111, the center of the first inner heater 111*h* may be the entirety or a portion of a circle that surrounds the center M of the microheater layer 1. The distance in the diameter between the center of the first inner heater 111*h* and the center of the second inner heater 113*h* may denote a distance in a diameter direction between two circles.

A thickness in the diameter direction of the first outer region 131 may be called a first outer thickness re (i.e., a first outer annular width). For example, the first outer thickness re may correspond to a difference between the second outer distance (i.e., the sixth radius) and the first outer distance (i.e., the fifth radius). A thickness in the diameter direction of the second outer region 133 may be called a second outer thickness re' (i.e., a second outer annular width). For example, the second outer thickness re' may correspond to a difference between the third outer distance (i.e., the seventh radius) and the second outer distance (i.e., the sixth radius). A thickness in the diameter direction of the third outer region 135 may be called a third outer thickness re" (i.e., a third outer annular width). For example, the third outer thickness re" may correspond to a difference between the fourth outer distance (i.e., the eighth radius) and the third outer distance (i.e., the seventh radius). A first outer spacing distance se may correspond to a distance in the diameter direction between the center of the first outer heater 131*h* and a center of the second outer heater 133*h*. In an exemplary embodiment, the first outer spacing distance se may correspond to a fifth radial distance which is the shortest distance between an imaginary circular line on which the center of the first outer heater 131*h* is located and an imaginary circular line on which the center of the second outer heater 133*h*. The imaginary circular lines may be concentric with respect to the center M of the microheater layer 1. A second outer spacing distance se' may correspond to a distance in the diameter direction between the center of the second outer heater 133*h* and a center of the third outer heater 135*h*. In an exemplary embodiment, the second outer spacing distance se' may correspond to a sixth radial distance which is the shortest distance between an imaginary circular line on which the center of the second outer heater 133*h* is located and an imaginary circular line on which the center of the third outer heater 135*h*. The imaginary circular lines may be concentric with respect to the center M of the microheater layer 1.

In some example embodiments, one or more of the first outer thickness re, the second outer thickness re', and the third outer thickness re" may be smaller than the smallest one of the first inner thickness, the second inner thickness, the third inner thickness ri, and the fourth inner thickness ri'. For example, one or more of the first outer region 131, the second outer region 133, and the third outer region 135 may be thinner than the thinnest one of the first inner region 111, the second inner region 113, the third inner region 115, and the fourth inner region 117. For example, each of the first outer thickness re, the second outer thickness re', and the third outer thickness re" may be smaller than the smallest one of the first inner thickness, the second inner thickness, the third inner thickness ri, and the fourth inner thickness ri'. Alternatively, when the inner region 11 is divided into only one single region and thus is substantially the same as or similar to the first inner region 111, one or more of the first outer thickness re, the second outer thickness re', and the third outer thickness re" may be less than the first inner thickness.

One or more of the first outer spacing distance se and the second outer spacing distance se' may be smaller than the smallest one of the first inner spacing distance, the second inner spacing distance, the third inner spacing distance si, and the fourth inner spacing distance si'. For example, the first outer spacing distance se may be smaller than the first inner spacing distance and the second inner spacing distance. The first outer spacing se between the first outer heater 131*h* and the second outer heater 133*h* may be smaller than the first inner spacing between the first inner heater 111*h* and the second inner heater 113*h*. For example, the outer heaters may be disposed in the diameter direction more densely than the inner heaters. In an exemplary embodiment, the fourth inner spacing distance si' may be smaller than the first inner spacing distance, the second inner spacing distance, and the third inner spacing distance si.

Referring back to FIGS. 5 and 6, about 15 mm to about 20 mm may be given as an arc length d1 in the circumferential direction of one or more of the first fine outer region 1311, the second fine outer region 1331, and the third fine outer region 1351. The present inventive concepts, however, are not limited thereto, and other values may be selected based on detailed designs.

According to an electrostatic chuck and a semiconductor fabrication method using a plasma processing apparatus including the same of the present inventive concepts, it may be possible to control the temperature of the wafer W. Referring back to FIG. 1, the wafer W may be inserted into the plasma chamber R and then disposed on the electrostatic chuck C. It may be possible to measure and control the temperature of the wafer W disposed on the electrostatic chuck C. The wafer W may be needed to be heated to different temperatures along a radius direction thereof. Referring again to FIG. 4, the first outer region 131 and the second outer region 133 may be controlled to reach different temperatures. For example, the controller T may control the heater power source H such that the first outer heater 131h on the first outer region 131 may be heated to a first temperature. At the same time, the controller T may control the heater power source H such that the second outer heater 133h on the second outer region 133 may be heated to a second temperature. The first temperature and the second temperature may be different from each other. An edge region of microheater layer 1 may be minutely or finely divided in the diameter direction compared to the inner region, and the finely-divided edge regions may be heated independently of each other. In an exemplary embodiment, the microheater layer 1 may include a plurality of first annular regions in the inner region 11 and a plurality of second annular regions in the outer region 13. The plurality of first annular regions may have the same first annular width. The plurality of second annular regions may have the same second annular width which is smaller than the first annular width. In an exemplary embodiment, the inner region 11 may further include a third annular region between the outermost first annular region of the plurality of first annular regions and the innermost second annular region of the plurality of second annular regions. The third annular region may have a third annular width which is smaller than the first annular width and greater than the second annular width. In an exemplary embodiment, a temperature of each of the plurality of annular regions may be independently controlled from the remaining annular regions. Such arrangement of the annular regions in the microheater layer 1 may allow a fine temperature control on the edge region of the wafer W.

In some example embodiments, the controller T may receive information about measured temperatures of the wafer W. The controller T may use information about each section of the wafer W and may calculate the degree of heat required for heating the wafer W. When the controller T calculates the degree of heat required for heating the wafer W, the controller T may control the heater power source H to minutely adjust the temperature of the wafer W.

According to an electrostatic chuck and a plasma processing apparatus including the same in accordance with some example embodiments of the present inventive concepts, an outer region of a microheater layer is divided into a plurality of regions in a diameter direction, and an outer heater may be positioned on each of the plurality of regions. In addition, a thickness in the diameter direction of each of the plurality of outer regions may be smaller than a thickness in the diameter direction of an inner region. The heaters on the outer regions may be disposed densely in the diameter direction. Therefore, a minute temperature control may be possible in the diameter direction on the outer region. For example, when the minute temperature control is required in the diameter direction on the edge region of the wafer, the required temperature control may be performed by using a plurality of outer heaters which will be minutely disposed in the diameter direction. Accordingly, it may be possible to improve distribution at the edge region of the wafer and to increase a yield of semiconductor process.

In an exemplary embodiment, a plurality of first heaters (e.g., elements 111h, 113h, 115h and 117h) may be arranged in the inner region 11, and a plurality of second heaters (e.g., elements 131h, 133h, and 135h) may be arranged in the outer region 13. Each of the first heater and the second heater may be of a spiral shape, but the second heater may have a size smaller than that of the first heater in a radius direction of the microheater layer 1.

Figure 7:
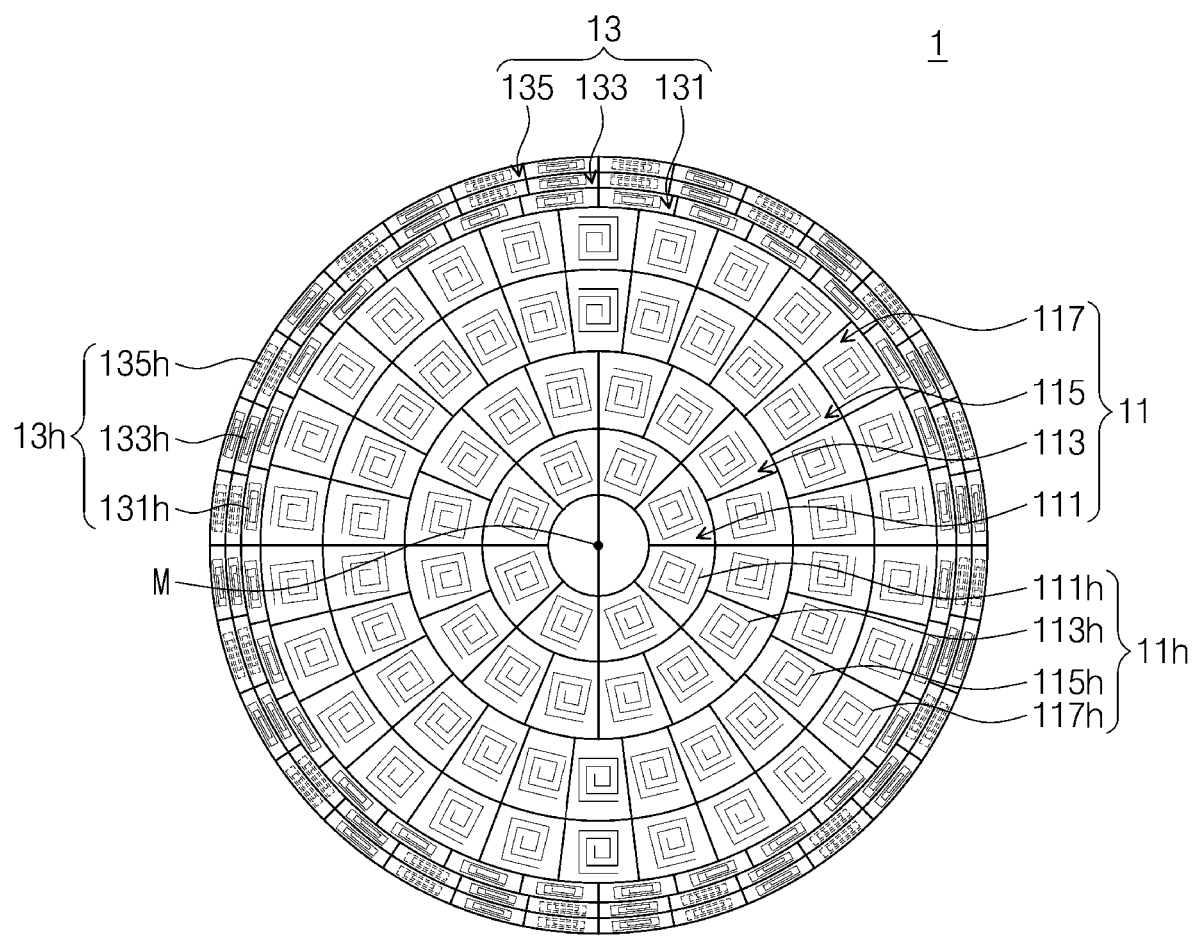
FIG. 7 illustrates a plan view showing an example of FIG. 4.

FIG. 7 illustrates a plan view showing an example of FIG. 4.

Referring to FIG. 7, a plurality of first outer heaters 131h, a plurality of second outer heaters 133h, and/or a plurality of third outer heaters 135h may be controlled independently of each other. The controller (see T of FIG. 1) may independently control on/off of the plurality of first outer heaters 131h, the plurality of second outer heaters 133h, and/or the plurality of third outer heaters 135h. For example, the controller T may control the heater power source H to adjust on/off of every second one of the second outer heaters 133h in the circumferential direction and/or on/off of every second one of the third outer heaters 135h in the circumferential direction. In FIG. 7, heaters expressed by dotted lines may be switched off, and only heaters expressed by solid lines may be switched on. As every second one of outer heaters is switched on or off, it may be possible to reach desired temperatures. In consideration of circumferential thermal diffusion from heated heaters, a minute temperature control may be easily accomplished using the on-off control at every second one of heaters in the circumferential direction.

According to an electrostatic chuck and a plasma processing apparatus including the same in accordance with some example embodiments of the present inventive concepts, an interval between outer heaters may be appropriately selected such that the on-off control at every second one of heaters in the circumferential direction may accomplish the minute temperature control. Therefore, it may be possible to easily control temperatures of wafers and to improve temperature distributions of wafers.

Figure 8:
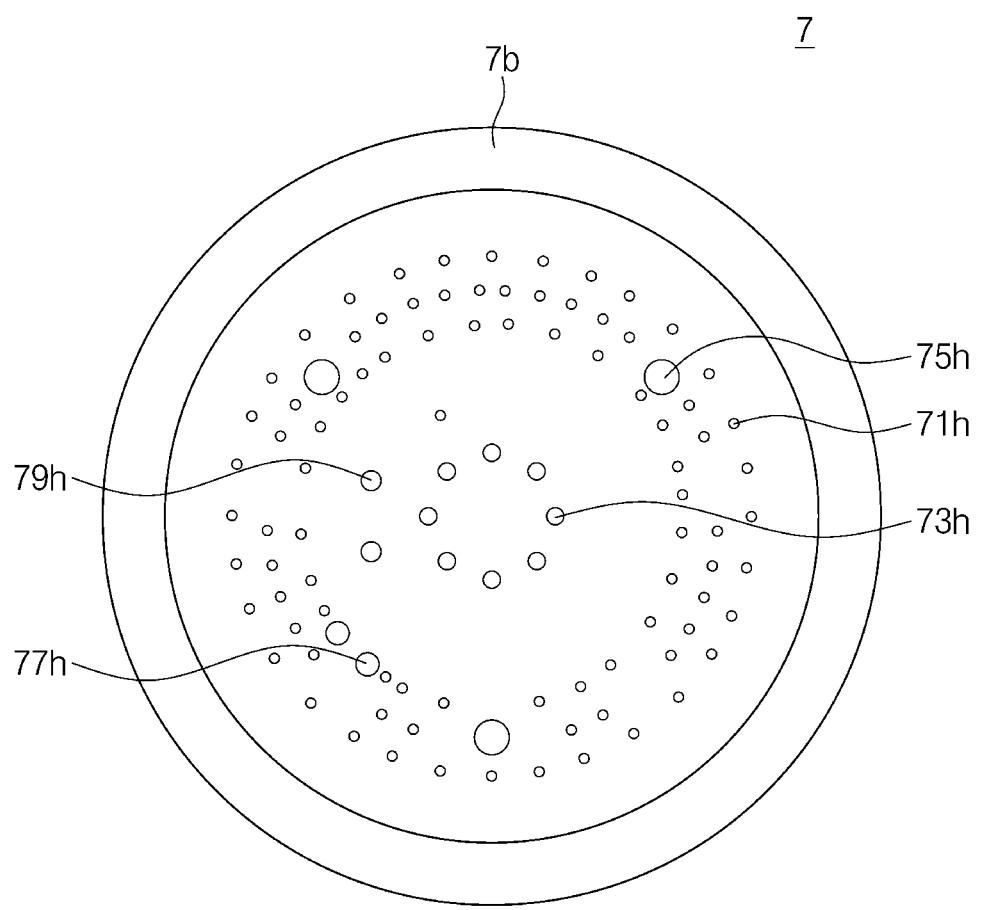
FIG. 8 illustrates a bottom view showing a plasma electrode according to some example embodiments of the present inventive concepts.

FIG. 8 illustrates a bottom view showing a plasma electrode according to some example embodiments of the present inventive concepts.

Referring to FIG. 8, the plasma electrode 7 may have a plurality of holes that extend from a bottom surface 7b to a top surface thereof. For example, the plasma electrode 7 may have a microheater hole 71h, a macroheater hole 73h, a lift pin hole 75h, a heat exchange gas hole 77h, and an electrostatic voltage hole 79h.

A microheater power connector MIC as shown in FIG. 2 may be inserted into the microheater hole 71h. The microheater power connector may connect the diode board (see b1 of FIG. 2) to the upper electrode layer (see 21 of FIG. 3). The microheater power connector may supply the microheater layer (see 1 of FIG. 3) with a microheater power transferred from the heater power source (see H of FIG. 2) to the diode board b1. In some example embodiments, the microheater hole 71h may be provided in plural. The plurality of microheater holes 71h may be arranged along the circumferential direction.

A macroheater power connector MAC as shown in FIG. 3 may be inserted into the macroheater hole 73h. The macroheater power connector may connect the diode board (see b1 of FIG. 2) to the lower electrode layer (see 23 of FIG. 3). The macroheater power connector may supply the macroheater layer (see 3 of FIG. 3) with a macroheater power transferred from the heater power source (see H of FIG. 2) to the diode board b1. In some example embodiments, the macroheater hole 73h may be provided in plural. The plurality of macroheater holes 73h may be arranged along the circumferential direction.

A lift pin (not shown) may be inserted into the lift pin hole 75h. The lift pin may lift the wafer (see W of FIG. 1).

A heat exchange gas may flow through the heat exchange gas hole 77h. The heat exchange gas may include a helium (He) gas. The heat exchange gas may exchange heat between the wafer (see W of FIG. 1) and the electrostatic chuck (see C of FIG. 1).

An electrostatic voltage connector (not shown) may be inserted into the electrostatic voltage hole 79h. The electrostatic voltage connector may connect the chuck electrode power source (see E of FIG. 1) to the chuck electrode (see 5 of FIG. 3). The electrostatic voltage connector may provide the chuck electrode 5 with an electrostatic voltage supplied from the chuck electrode power source E.

Similar to the plasma electrode 7, the lower electrode layer 23 and the ground layer 25 may each have a plurality of holes as shown in FIG. 3. Although not shown, similar to the plasma electrode 7, the diode board b1, the control board b2, the distribution member 9, and the heater power transmitter 4 may also each have a plurality of holes.

Figure 9:
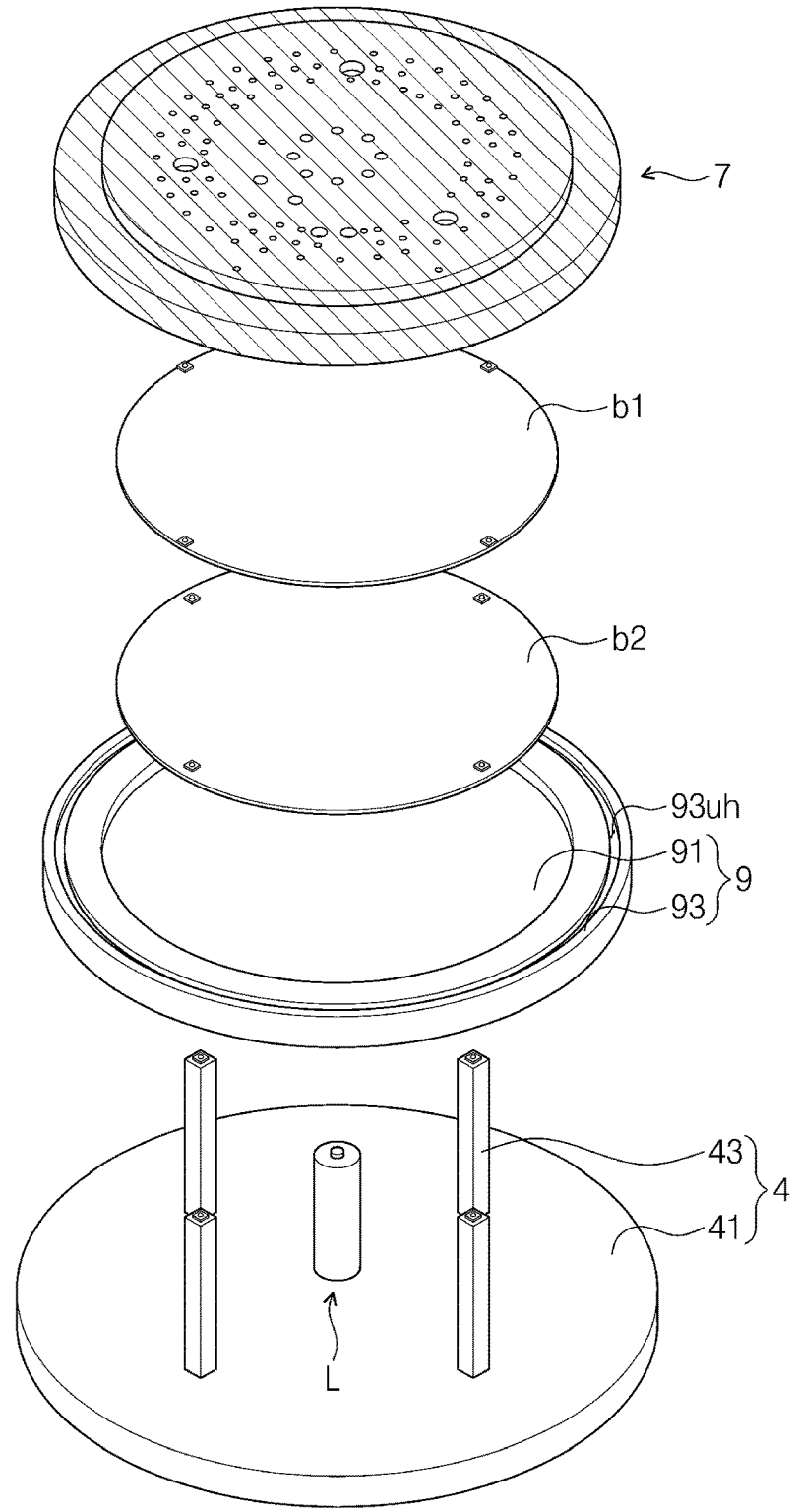
FIG. 9 illustrates an exploded perspective view partially showing a plasma processing apparatus according to some example embodiments of the present inventive concepts.
Figure 10:
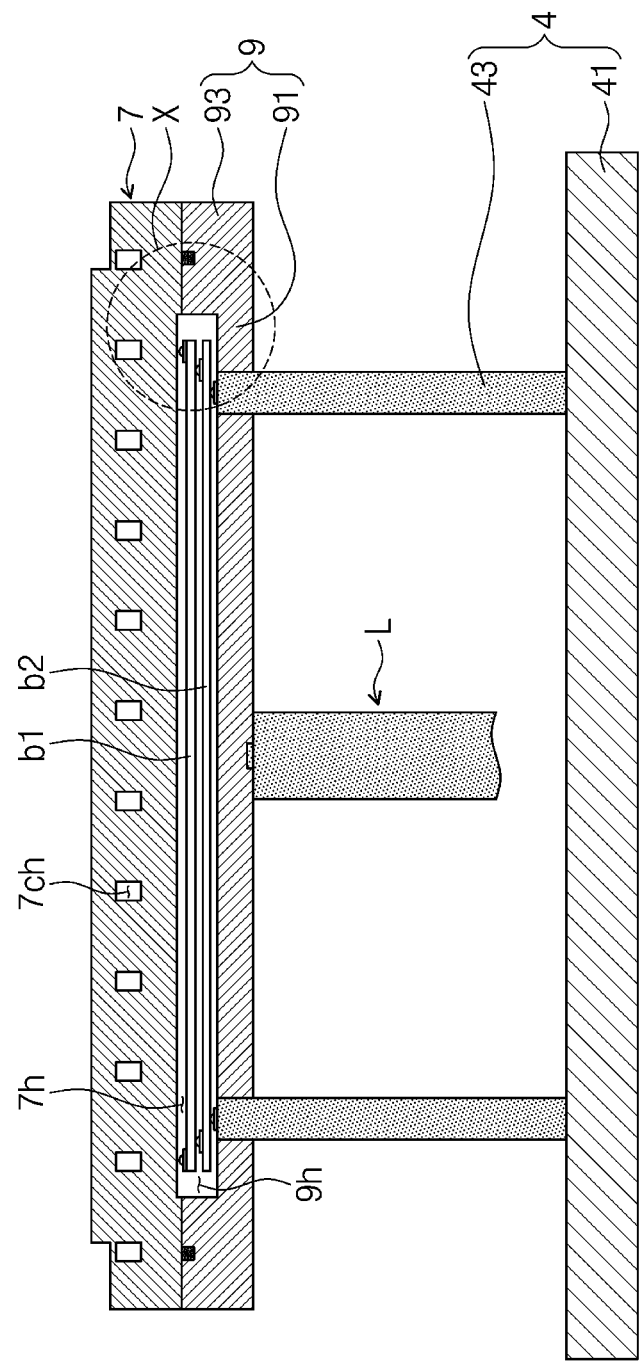
FIG. 10 illustrates a cross-sectional view partially showing a plasma processing apparatus according to some example embodiments of the present inventive concepts.

FIG. 9 illustrates an exploded perspective view partially showing a plasma processing apparatus according to some example embodiments of the present inventive concepts. FIG. 10 illustrates a cross-sectional view partially showing a plasma processing apparatus according to some example embodiments of the present inventive concepts.

Referring to FIGS. 9 and 10, the distribution member 9 may be positioned below the plasma electrode 7. The distribution member 9 may include a distribution plate 91 and a contact member 93. The distribution plate 91 may have a circular plate shape. The supply line L may be connected to a bottom surface of the distribution plate 91. For example, the supply line L may be coupled to a center of the bottom surface of the distribution plate 91. The distribution plate 91 may be connected through the supply line L to the bias power source (see B of FIG. 2). The supply line L may transfer the bias power to the distribution plate 91. The contact member 93 may upwardly extend from an edge of the distribution plate 91 to have a predetermined height. For example, the contact member 93 may extend from the edge of the distribution plate 91 toward the plasma electrode 7. The contact member 93 may have a hollow cylindrical shape. A board receiving hole 9h may be defined by a lateral surface of the contact member 93 and a top surface of the distribution plate 91. The contact member 93 may have a shield ring receiving hole 93uh. The shield ring receiving hole 93uh may be deeply recessed downwardly from a top surface of the contact member 93. A shield ring (see Sr of FIG. 11) may be inserted into the shield ring receiving hole 93uh. A detailed description thereof will be further discussed below. The shield ring receiving hole 93uh may be formed along the circumferential direction on the top surface of the contact member 93. For example, the shield ring receiving hole 93uh may have a circular shape. The plasma electrode 7 may have a lower recess hole 7h on its bottom surface. For example, the bottom surface of the plasma electrode 7 may be partially recessed upwardly to provide the lower recess hole 7h. The diode board b1 and/or the control board b2 may be positioned between the plasma electrode 7 and the distribution member 9. For example, the diode board b1 and/or the control board b2 may have their top surfaces lower that the bottom surface of the plasma electrode 7. The diode board b1 may be located higher than the control board b2. For example, the control board b2 may be disposed below the diode board b1. The control board b2 may upwardly transfer the heater power. The diode board b1 may upwardly transfer the heater power received from the control board b2. The diode board b1 may prevent the heater power from being transferred in an opposite direction. In some example embodiments, the board receiving hole 9h may receive the diode board b1 and the control board b2. The contact member 93 may contact the bottom surface of the plasma electrode 7. The bias power may be transferred from the distribution plate 91 through the contact member 93 to the plasma electrode 7. A detailed description thereof will be further discussed below with reference to FIG. 10. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

The heater power transmitter 4 may include a heater power distribution plate 41 and a heater power transfer member 43. The heater power distribution plate 41 may have a circular plate shape. The heater power distribution plate 41 may be connected to the heater power source (see H of FIG. 2). The heater power transfer member 43 may have a rod shape. The heater power transfer member 43 may upwardly extend from a top surface of the heater power distribution plate 41. The heater power transfer member 43 may be connected to the control board b2. For example, the heater power transfer member 43 may connect the heater power distribution plate 41 to the control board b2. In some example embodiments, the heater power transfer member 43 may be provided in plural. The plurality of heater power transfer members 43 may be disposed symmetrically with each other about a center of the heater power distribution plate 41. For example, when four heater power transfer members 43 are provided, the four heater power transfer members 43 may be arranged spaced apart from each other at 90 degrees around the center of the heater power distribution plate 41. The heater power distribution plate 41 may distribute the heater power transferred from the heater power source H to the control board b2 through the heater power transfer members 43 which are symmetrically arranged with respect to the center of the heater power distribution plate 41.

Figure 11:
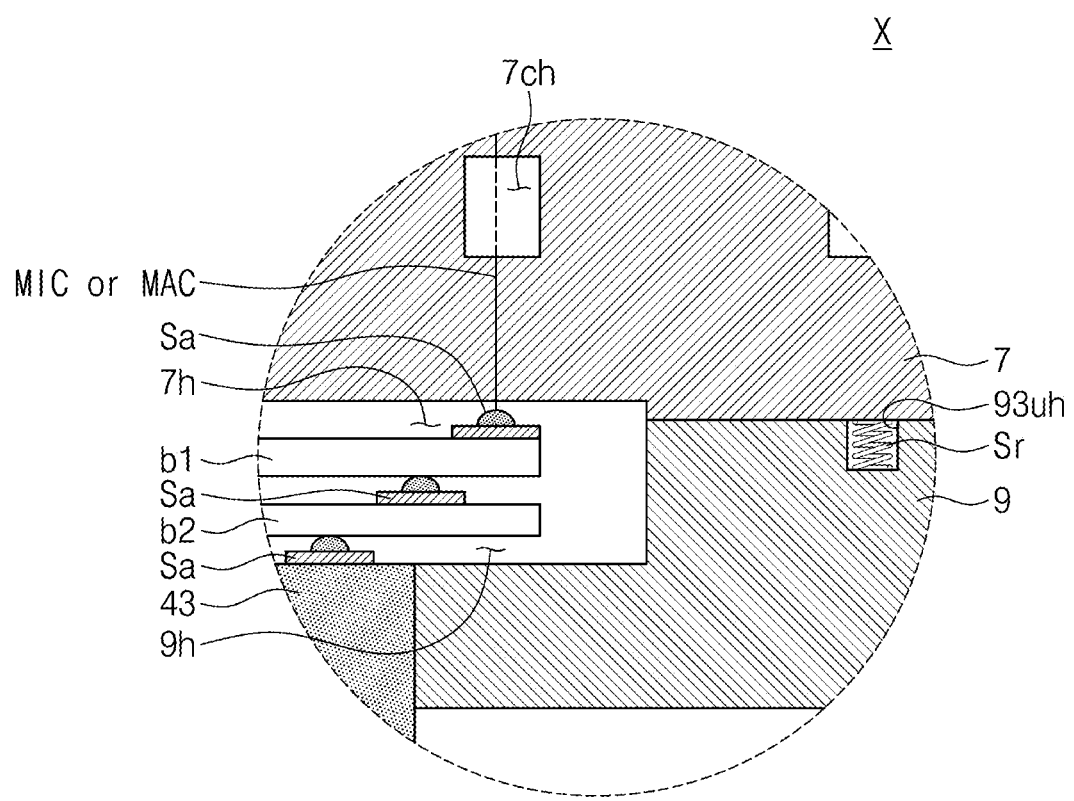
FIG. 11 illustrates an enlarged view showing section X of FIG. 10.
Figure 12:
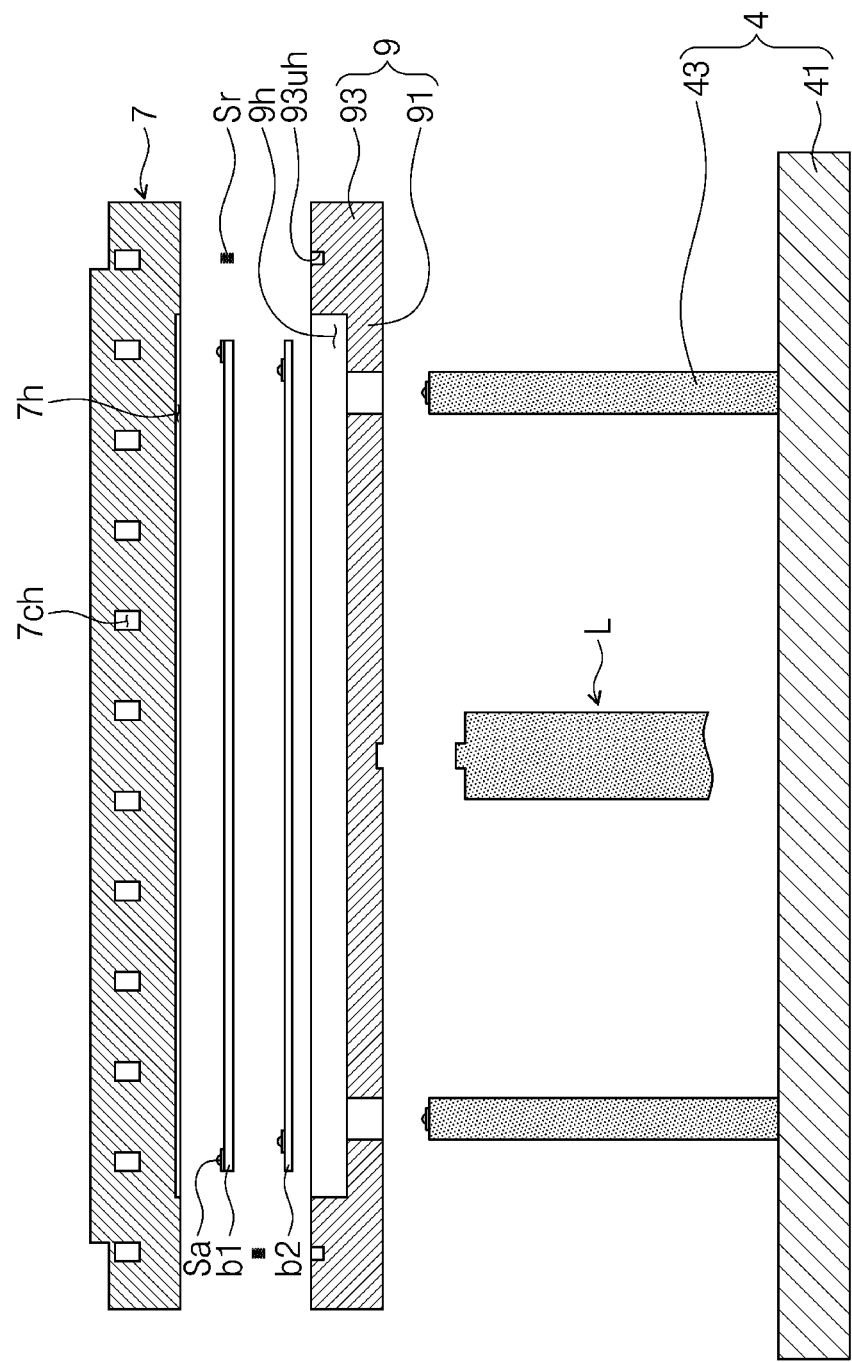
FIG. 12 illustrates an exploded cross-sectional view partially showing a plasma processing apparatus according to some example embodiments of the present inventive concepts.

FIG. 11 illustrates an enlarged view showing section X of FIG. 10. FIG. 12 illustrates an exploded cross-sectional view partially showing a plasma processing apparatus according to some example embodiments of the present inventive concepts.

Referring to FIG. 11, the heater power transfer member 43 and the control board b2 may be electrically connected to each other through a spring connector Sa. A portion of the spring connector Sa may be positioned in the lower recess hole 7h to connect b1 to the microheater power connector MIC or the macroheater power connector MAC. The spring connector Sa may include a conductive material. The spring connector Sa may also be disposed between the control board b2 and the diode board b1 and between the plasma electrode 7 and the diode board b1.

Referring to FIG. 12, because the plasma electrode 7 and the diode board b1 are connected to each other through the spring connector Sa, it may be easy to lift and disassemble the plasma electrode 7 from the diode board b1. The disassembly of the diode board b1 from the control board b2 and/or the disassembly of the heater power transfer member 43 from the control board b2 may also be performed promptly.

According to an electrostatic chuck and a plasma processing apparatus including the same in accordance with some example embodiments of the present inventive concepts, the spring connector Sa may be used to electrically connect components. No coupling procedure may be required for electrical connection. It may be possible to promptly and simply perform assembly for component connection and/or disassembly for maintenance. The diode board b1 and/or the control board b2 are positioned below the plasma electrode 7, and replacement of the diode board b1 and/or the control board b2 may be easily accomplished after lifting the plasma electrode 7 alone. For example, when the diode board b1 and/or the control board b2 need replacement due to their trouble, it may be possible to simply and promptly replace the diode board b1 and/or the control board b2 without replacement of other components.

Referring back to FIG. 11, the shield ring Sr may be inserted into the shield ring receiving hole 93uh. The shield ring Sr may include a resilient material. For example, the shield ring Sr may include a spring. The shield ring Sr may include a conductive material. For example, the shield ring Sr may include a metallic material. In an exemplary embodiment, the shield ring Sr may be formed of a metallic material. In some example embodiments, the shield ring Sr may extend in the circumferential direction along the shield ring receiving hole 93uh. The shield ring Sr may be positioned between the distribution member 9 and the plasma electrode 7. When the plasma electrode 7 is disposed on the distribution member 9, the shield ring Sr may be compressed in the shield ring receiving hole 93uh. The shield ring Sr may be in contact with the distribution member 9 and the plasma electrode 7, while being compressed in the shield ring receiving hole 93uh. In some example embodiments, the shield ring Sr may electrically connect the distribution member 9 to the plasma electrode 7. Even when no even contact is provided between the top surface of the contact member 93 and the bottom surface of the plasma electrode 7, the distribution member 9 and the plasma electrode 7 may be electrically connected to each other through the shield ring Sr. Accordingly, the radio-frequency power may be transferred from the distribution member 9 to the plasma electrode 7.

Figure 13:
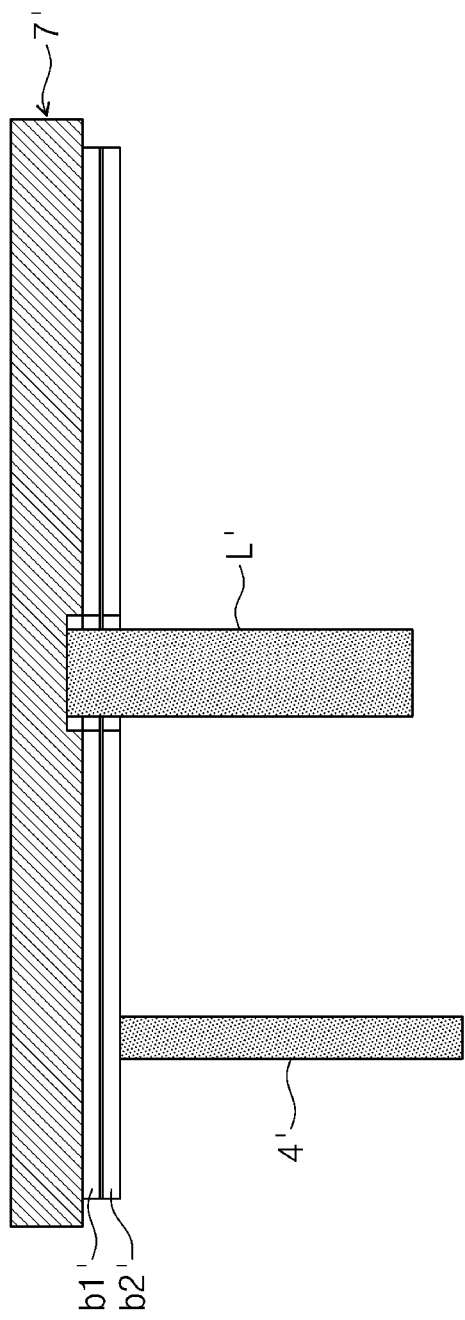
FIG. 13 illustrates a cross-sectional view partially showing a plasma processing apparatus according to comparative examples.

FIG. 13 illustrates a cross-sectional view partially showing a plasma processing apparatus according to comparative examples.

Referring to FIG. 13, a supply line L' may be connected to a center of a bottom surface of a plasma electrode 7'. A diode board b1' and a control board b2' may each be required to have at its center a hole into which the supply line L' is inserted. Therefore, the diode board b1' and the control board b2' may experience noise occurring due to a radio-frequency power that flows through the supply line L'. The diode board b1' and the control board b2' may abnormally operate due to noise occurring at signals of the diode board b1' and the control board b2'. A heater power transmitter 4' may be installed closer to one side of the control board b2'. Therefore, heater power that flows through the heater power transmitter 4' may be asymmetrically supplied to the plasma electrode 7' through the diode board b1' and the control board b2'. In a plasma processing apparatus, symmetric supply of heat power to an electrostatic chuck is not obtained.

Referring back to FIG. 12, the distribution member 9 coupled to the bottom of the plasma electrode 7 may symmetrically distribute the radio-frequency power to the plasma electrode 7 through the contact member 93. Therefore, at least one of the diode board b1 and the control board b2 may have no hole to accommodate the supply line L. The diode board b1 and/or the control board b2 may be free of the occurrence of noise due to the radio-frequency power which is supplied through the supply line L. The contact member 93 may circularly contact an edge of the plasma electrode 7, and thus the symmetry of contact between the contact member 93 and the plasma electrode 7 may be secured. The heater power transmitter 4 may also be installed symmetrically, and thus the plasma processing apparatus U may secure symmetry of supplying of heat power.

Figure 14:
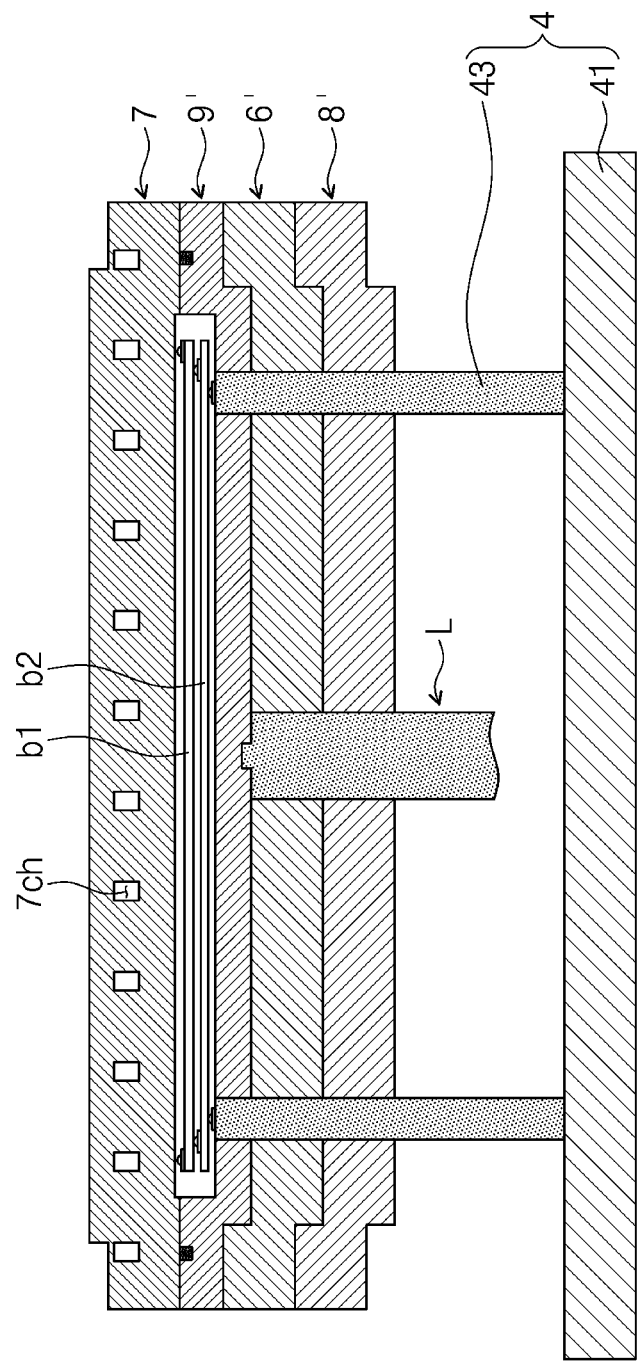
FIG. 14 illustrates a cross-sectional view partially showing a plasma processing apparatus according to some example embodiments of the present inventive concepts.
Figure 15:
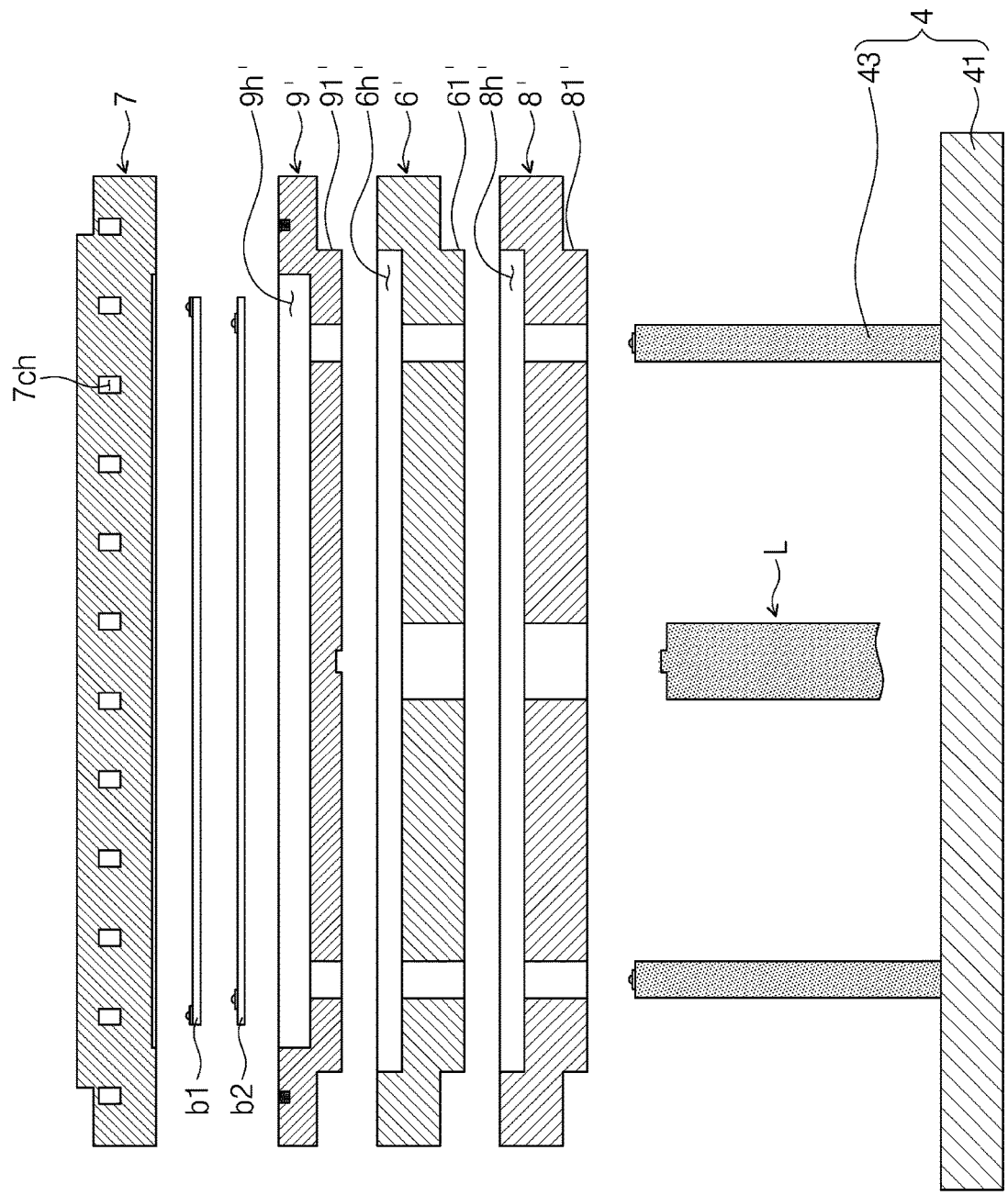
FIG. 15 illustrates an exploded cross-sectional view partially showing a plasma processing apparatus according to some example embodiments of the present inventive concepts.

FIG. 14 illustrates a cross-sectional view partially showing a plasma processing apparatus according to some example embodiments of the present inventive concepts. FIG. 15 illustrates an exploded cross-sectional view partially showing a plasma processing apparatus according to some example embodiments of the present inventive concepts.

For convenience of description, the following will omit the explanation of contents substantially the same as or similar to those discussed with reference to FIGS. 1 to 13.

Referring to FIGS. 14 and 15, a distribution member 9' may be recessed upwardly on its edge bottom surface. For example, a distribution member recession 91' may be provided at the edge bottom surface of the distribution member 9'. An isolator 6' may be partially positioned in the distribution member recession 91'. The isolator 6' may be recessed upwardly on its edge bottom surface. For example, an isolator recession 61' may be provided at the edge bottom surface of the isolator 6'. A ground plate 8' may be partially positioned in the isolator recession 61'. An isolator upper recession 6h' may be provided at a center of a top surface of the isolator 6'. A portion of the distribution member 9' may be positioned in the isolator upper recession 6h'. The ground plate 8' may be recessed upwardly on its edge bottom surface. For example, a ground plate recession 81' may be provided at the edge bottom surface of the ground plate 8'. A ground plate upper recession 8h' may be provided at a center of a top surface of the ground plate 8'. A portion of the isolator 6' may be provided in the ground plate upper recession 8h'. Such configuration may reduce a total volume of the distribution member 9', the isolator 6', and the ground plate 8'.

According to a plasma processing apparatus and a semiconductor fabrication method using the same in accordance with the present inventive concepts, it may be possible to minutely control a temperature at an edge of a wafer.

According to a plasma processing apparatus and a semiconductor fabrication method using the same in accordance with the present inventive concepts, it may be possible to improve temperature distribution of the wafer.

According to a plasma processing apparatus and a semiconductor fabrication method using the same in accordance with the present inventive concepts, a diode board and/or a control board may be free of the occurrence of noise due to a RF supply line.

According to a plasma processing apparatus and a semiconductor fabrication method using the same in accordance with the present inventive concepts, a board may be simply and promptly replaced alone when the diode board and/or the control board need their replacement.

According to a plasma processing apparatus and a semiconductor fabrication method using the same in accordance with the present inventive concepts, it may be possible to secure symmetry of supplying heat power.

According to a plasma processing apparatus and a semiconductor fabrication method using the same in accordance with the present inventive concepts, it may be possible to easily assemble and disassemble.

Effects of the present inventive concepts are not limited to the mentioned above, and other effects which have not been mentioned above will be clearly understood to those skilled in the art from the following description.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A plasma processing apparatus, comprising:
a plasma electrode;
an electrostatic chuck on the plasma electrode;
a distribution member below the plasma electrode and having a board receiving hole;
a control board in the board receiving hole of the distribution member;
a diode board on the control board and in the board receiving hole of the distribution member;
a plurality of heater power transfer members penetrating the distribution member; and
spring connectors connected between the control board and the diode board and between the control board and the plurality of heater power transfer members,
wherein the diode board is configured to prevent a heater power transfer to the control board,
wherein the plurality of heater power transfer members are symmetrically arranged with each other about a center of the distribution member,
wherein the spring connectors contact surfaces of the control board, surfaces of the diode board and the plurality of heater power transfer members, thereby electrically connecting them to each other,
wherein the distribution member circularly contacts an edge of the plasma electrode and transmits a radio-frequency power to the plasma electrode,
wherein the electrostatic chuck includes:
a microheater layer to heat a wafer; and
a chuck electrode on the microheater layer,
wherein the microheater layer includes:
an inner heater part on an inside of the microheater layer; and
an outer heater part outside the inner heater part,
wherein the inner heater part includes:
a first inner heater in a first inner region that circumferentially surrounds a center of the microheater layer; and
a second inner heater in a second inner region that is outside and circumferentially surrounds the first inner region,
wherein the outer heater part includes:
a first outer heater in a first outer region that is outside and circumferentially surrounds the second inner region; and
a second outer heater in a second outer region that is outside and circumferentially surrounds the first outer region, and
wherein a distance in a diameter direction between a center of the first outer heater and a center of the second outer heater is less than a distance in the diameter direction between a center of the first inner heater and a center of the second inner heater.

2. The plasma processing apparatus of claim 1,
wherein the first outer region is divided into a plurality of first fine outer regions along a circumferential direction,
the first outer heater is provided on each of the plurality of first fine outer regions,
the second outer region is divided into a plurality of second fine outer regions along the circumferential direction, and
the second outer heater is provided on each of the plurality of second fine outer regions.

3. The plasma processing apparatus of claim 2,
wherein a width in the circumferential direction of each of the plurality of first fine outer regions is in a range of about 15 mm to about 20 mm.

4. The plasma processing apparatus of claim 1,
wherein the first inner heater, the second inner heater, the first outer heater, and the second outer heater are controlled independently of each other.

5. The plasma processing apparatus of claim 1,
wherein the outer heater part further includes a third outer heater in a third outer region that is outside and circumferentially surrounds the second outer region.

6. The plasma processing apparatus of claim 5,
wherein a distance in the diameter direction between the center of the second outer heater and a center of the third outer heater is less than the distance in the diameter direction between the center of the first inner heater and the center of the second inner heater.

7. The plasma processing apparatus of claim 5,
wherein a distance in the diameter direction between the first outer region and the center of the microheater layer is in a range of about 120 mm to about 130 mm.

8. The plasma processing apparatus of claim 1, further comprising a macroheater layer below the microheater layer.

9. A plasma processing apparatus, comprising:
a plasma electrode;
an electrostatic chuck on the plasma electrode;
a distribution member coupled to the plasma electrode, wherein the distribution member includes a disk-type distribution plate and a contact member that extends from an edge of the disk-type distribution plate toward a bottom surface of the plasma electrode;
a control board between the plasma electrode and the disk-type distribution plate of the distribution member;
a diode board between the control board and the plasma electrode;
a heater power transmitter including a heater power distribution plate and a plurality of heater power transfer members vertically erected from an upper surface of the heater power distribution plate;
first spring connectors electrically connecting the plurality of heater power transfer members and the control board therebetween; and
second spring connectors electrically connecting the control board and the diode board therebetween,
wherein the diode board is configured to prevent a heater power transfer to the control board,
wherein the plurality of heater power transfer members penetrate the disk-type distribution plate and are symmetrically arranged with each other about a center of the heater power distribution plate,
wherein the first spring connectors contact a bottom surface of the control board,
wherein the second spring connectors contact a bottom surface of the diode board,
wherein the electrostatic chuck includes:

a macroheater layer;

a microheater layer on the macroheater layer; and a chuck electrode on the microheater layer, wherein the microheater layer includes:

an inner heater part on an inside of the microheater layer; and an outer heater part outside the inner heater part, wherein the inner heater part includes a first inner heater in a first inner region that circumferentially surrounds a center of the microheater layer, wherein the outer heater part includes:

a first outer heater in a first outer region that is outside and circumferentially surrounds the first inner region; and a second outer heater in a second outer region that is outside and circumferentially surrounds the first outer region, and wherein each of a thickness in a diameter direction of the first outer region and a thickness in the diameter direction of the second outer region is less than a thickness in the diameter direction of the first inner region.

10. The plasma processing apparatus of claim 9, wherein the first outer heater is provided in plural along a circumferential direction, and the second outer heater is provided in plural along the circumferential direction.

11. The plasma processing apparatus of claim 10, further comprising:

a controller that controls heater power, wherein the controller independently controls the plurality of first outer heaters and the plurality of second outer heaters.

12. The plasma processing apparatus of claim 11, wherein the controller controls on/off of every second one of the plurality of first outer heaters in the circumferential direction.

13. The plasma processing apparatus of claim 11, further comprising a bias power source that supplies the plasma electrode with a radio-frequency power.

14. The plasma processing apparatus of claim 13, further comprising:

a supply line that connects the distribution member to the bias power source, wherein the supply line is on the center of the heater power distribution plate.

15. The plasma processing apparatus of claim 14, wherein the contact member has a shield ring receiving hole that is downwardly recessed from a top surface of the contact member, and the shield ring receiving hole receives a shield ring.

16. The plasma processing apparatus of claim 9, wherein the outer heater part further includes a third outer heater in a third outer region that is outside and circumferentially surrounds the second outer region, and wherein a thickness in the diameter direction of the third outer region is less than the thickness in the diameter direction of the first inner region.

* * * * *